(12) United States Patent
Buonsanti et al.

(10) Patent No.: US 8,961,828 B2
(45) Date of Patent: Feb. 24, 2015

(54) COLLOIDAL INFRARED REFLECTIVE AND TRANSPARENT CONDUCTIVE ALUMINUM-DOPED ZINC OXIDE NANOCRYSTALS

(75) Inventors: Raffaella Buonsanti, Berkeley, CA (US); Delia J. Milliron, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/989,306

(22) PCT Filed: Nov. 23, 2011

(86) PCT No.: PCT/US2011/062036
§ 371 (c)(1),
(2), (4) Date: Jun. 28, 2013

(87) PCT Pub. No.: WO2012/071507
PCT Pub. Date: May 31, 2012

(65) Prior Publication Data
US 2013/0266800 A1    Oct. 10, 2013

Related U.S. Application Data

(60) Provisional application No. 61/417,160, filed on Nov. 24, 2010.

(51) Int. Cl.
| | | |
|---|---|---|
| C09K 11/54 | (2006.01) | |
| H01B 1/02 | (2006.01) | |
| C30B 7/14 | (2006.01) | |
| C30B 29/16 | (2006.01) | |
| H01L 31/0224 | (2006.01) | |
| C01G 9/02 | (2006.01) | |
| C30B 29/22 | (2006.01) | |
| B82Y 30/00 | (2011.01) | |

(52) U.S. Cl.
CPC . *C30B 7/14* (2013.01); *C30B 29/16* (2013.01); *H01L 31/022483* (2013.01); *C01G 9/02* (2013.01); *C30B 29/22* (2013.01); *H01B 1/02* (2013.01); *C01P 2002/54* (2013.01); *C01P 2002/72* (2013.01); *C01P 2002/77* (2013.01); *C01P 2002/82* (2013.01); *C01P 2002/84* (2013.01); *C01P 2002/85* (2013.01); *C01P 2004/04* (2013.01); *C01P 2004/64* (2013.01); *B82Y 30/00* (2013.01)
USPC .............. 252/301.6 R; 252/512; 252/519.21; 252/519.51; 252/519.15; 117/68; 427/64

(58) Field of Classification Search
USPC ................ 252/301.6 R, 512, 519.21, 519.51, 252/519.15; 427/64; 117/68
See application file for complete search history.

(56) References Cited

U.S. PATENT DOCUMENTS

| | | | |
|---|---|---|---|
| 4,399,015 A | 8/1983 | Endo et al. | |
| 6,200,680 B1 * | 3/2001 | Takeda et al. | 428/402 |
| 7,622,371 B2 * | 11/2009 | Pan et al. | 438/500 |
| 7,646,144 B2 * | 1/2010 | Cok | 313/503 |
| 2005/0112849 A1 * | 5/2005 | Stott et al. | 438/478 |
| 2005/0126338 A1 * | 6/2005 | Yadav | 75/255 |
| 2006/0211152 A1 * | 9/2006 | Peng et al. | 438/3 |
| 2008/0083950 A1 * | 4/2008 | Pan et al. | 257/347 |
| 2009/0245858 A1 * | 10/2009 | Mizutani et al. | 399/111 |
| 2010/0236614 A1 | 9/2010 | Klimov et al. | |
| 2013/0259808 A1 * | 10/2013 | Chen et al. | 424/9.3 |

FOREIGN PATENT DOCUMENTS

| | | |
|---|---|---|
| WO | WO 2009/123763 | 10/2009 |
| WO | WO 2012/071507 | 5/2012 |

OTHER PUBLICATIONS

Ohyama et al., "Sol-Gel Preparation of Transparent and Conductive Aluminum-Doped Zinc Oxide Films with highly Preferential Crystal Orientation", J. Am. Ceram. Soc., 81(6), 1622-1632 (1998).*
International Search Report & Written Opinion Dated Apr. 11, 2012 for International Application No. PCT/US2011/062036.
Thu et al., "Synthesis of High-Quality Al-Doped ZnO Nanoink," Journal of Applied Physics, 107(1): 14308-1-14308-6, Published Jan. 5, 2010.
Serier et al., "Al-doped ZnO powdered materials: Al solubility limit and IR absorption properties," Solid State Sciences 11 (2009) 1192-1197, Published 2009.
Kusinski et al., "Transmission electron microscopy of solution-processed, intrinsic and Al-doped ZnO nanowires for transparent electrode fabrication," Journal of Microscopy, vol. 237, Pt 3 2010, pp. 443-449, Published 2009.
Chen et al., "The crystallization and physical properties of Al-doped ZnO nanoparticles," Applied Surface Science 254 (2008) 5791-5795, Published 2008.
Buonsanti et al., "Tunable Infrared Absorption and Visible Transparency of Colloidal Aluminum-Doped Zinc Oxide Nanocrystals," pubs.acs.org/NanoLett, Published Oct. 4, 2011.

* cited by examiner

*Primary Examiner* — Douglas McGinty
(74) *Attorney, Agent, or Firm* — Lowenstein Sandler LLP

(57) ABSTRACT

The present invention provides a method of preparing aluminum-doped zinc oxide (AZO) nanocrystals. In an exemplary embodiment, the method includes (1) injecting a precursor mixture of a zinc precursor, an aluminum precursor, an amine, and a fatty acid in a solution of a vicinal diol in a non-coordinating solvent, thereby resulting in a reaction mixture, (2) precipitating the nanocrystals from the reaction mixture, thereby resulting in a final precipitate, and (3) dissolving the final precipitate in an apolar solvent. The present invention also provides a dispersion. In an exemplary embodiment, the dispersion includes (1) nanocrystals that are well separated from each other, where the nanocrystals are coated with surfactants and (2) an apolar solvent where the nanocrystals are suspended in the apolar solvent. The present invention also provides a film. In an exemplary embodiment, the film includes (1) a substrate and (2) nanocrystals that are evenly distributed on the substrate.

17 Claims, 45 Drawing Sheets a

| Al% | $d_{TEM}$(nm) | $d_{XRD}$(nm) | a(Å) | c(Å) | Lattice strain (%) |
|---|---|---|---|---|---|
| 0 | 22.3±3.5 | 18.9 (2) | 3.2527(5) | 5.2139(1) | 0.34(3) |
| 0 | 12.5±1.7 | 12.9(4) | 3.2660(2) | 5.2331(4) | 0.21(5) |
| 0 | 6.4±0.7 | 6.7(1) | 3.2670(1) | 5.2322(2) | 0.40(3) |
| 7.3 | 15.5±1.8 | 14.2(1) | 3.2551(2) | 5.2160(3) | 0.36(2) |
| 6.5 | 10.1±1.4 | 7.7(3) | 3.2641(1) | 5.2193(2) | 0.45(2) |
| 4.4 | 5.5±0.7 | 6.1(1) | 3.2664(2) | 5.2245(5) | 0.66(2) |
| 20 | 41.5±4.5 | 25.6(3) | 3.2578(1) | 5.2203(2) | 0.28(1) |

COLLOIDAL INFRARED REFLECTIVE AND TRANSPARENT CONDUCTIVE ALUMINUM-DOPED ZINC OXIDE NANOCRYSTALS

RELATED APPLICATIONS

This application is a 371 of PCT Application No.: PCT/US11/062036 filed Nov. 23, 2011, which claims priority to U.S. Provisional Patent Application No. 61/417,160, filed Nov. 24, 2010, which are hereby incorporated by reference in their entirety.

STATEMENT OF GOVERNMENT SUPPORT

This invention was made with government support under Contract No. DE-AC02-05CH11231 awarded by the U.S. Department of Energy. The government has certain rights in this invention.

FIELD OF THE INVENTION

The present invention relates to the field of nanocrystals, and particularly relates to a method of preparing aluminum-doped zinc oxide nanocrystals, to a dispersion, and to a film.

BACKGROUND OF THE INVENTION

Aluminum-doped zinc oxide (AZO) is one of the most promising alternatives to replace the most commonly used indium tin oxide (ITO). Indeed, comparable electrical and optical performances have been demonstrated and the material cost is lower.

Reducing production cost is becoming a critical issue considering the ever-increasing demand for flat-panel displays, solar cells and smart windows.

Wet-chemistry represents a low cost alternative production technology compared to traditional techniques such as sputtering or evaporation, and NCs have the advantage over sol-gel methods that they are already crystalline before film deposition, reducing the thermal budget required for annealing.29'30

Aluminum-doped zinc oxide (AZO), with its comparable optical and electronic properties, represents a lower cost, less toxic, earth abundant alternative to the widely used transparent conducting oxide (TCO), indium tin oxide (ITO).[1] At the same time, TCO nanocrystals (NCs) have recently gained interest owing both to the low cost of solution processing and the potential to exploit size-dependent properties.[2-8] Deposition of colloidal TCO NCs as a nanoink is highly appealing for integration into emerging flexible electronics, such as displays, electronic paper or solar cells.[9] Moreover, their significantly higher surface area than conventionally deposited TCO thin films could enable improvements in devices like electrochromic windows and dye-sensitized solar cells, as well as biosensors.[10]

While the synthesis of ITO colloidal NCs has recently advanced markedly, it remains still a challenge to control dopant incorporation along with size, shape and solvent dispersability in zinc oxide based TCO NCs, i.e. aluminum doped zinc oxide (AZO), indium-doped zinc oxide (IZO) or gallium-doped zinc oxide (GZO).[2-8]

Only when the dopants occupy substitutional sites in the interior of the particles are free carriers introduced and the desired electrical and optical properties achieved.[11-14] Carefully balancing crystal growth and dopant incorporation rates is thus obligatory.

PRIOR ART

Up to know, few research papers[2-4] have been published on solution-based synthesis of AZO nanoparticles and none of them report about the optical properties in the NIR of the as-synthesized materials. NIR reflectance or absorbance is directly related to the doping efficiency and, therefore, it is extremely important for this class of materials.[11]

U.S. Pat. No. 4,399,015 describes a prior art method of fabricating an ITO film. Referring to prior art FIG. 1A, the prior art method includes a step 110 of depositing the ITO film on a heat-resisting substrate by sputtering using a metal alloy target of In—Sn in an atmosphere including an active gas, and a step 120 of heat-treating the ITO film at temperature between 550° C. to 650° C. in an oxygen-free atmosphere.

Prior art FIG. 1B shows photos of prior art AZO nanoparticles in chloroform at a concentration of 10 mg/mL. Prior art FIG. 1B(a) shows prior art AZO nanoparticles (10 input mol %), while prior art FIG. 1B(b) shows prior art ZnO nanoparticles.

Prior art FIG. 1C shows prior art AZO colloidal nanocrystals in a film with very poor control and characterization and no evidence of tunable near-infrared (NIR) reflectance with the doping content.

Therefore, a method of preparing aluminum-doped zinc oxide nanocrystals, a dispersion, and a film are needed.

SUMMARY OF THE INVENTION

The present invention provides a method of preparing aluminum-doped zinc oxide (AZO) nanocrystals. In an exemplary embodiment, the method includes (1) injecting a precursor mixture of a zinc precursor, an aluminum precursor, an amine, and a fatty acid in a solution of a vicinal diol in a non-coordinating solvent, thereby resulting in a reaction mixture, (2) precipitating the nanocrystals from the reaction mixture, thereby resulting in a final precipitate, and (3) dissolving the final precipitate in an apolar solvent. The present invention also provides a dispersion. In an exemplary embodiment, the dispersion includes (1) nanocrystals that are well separated from each other, where the nanocrystals are coated with surfactants and (2) an apolar solvent where the nanocrystals are suspended in the apolar solvent. The present invention also provides a film. In an exemplary embodiment, the film includes (1) a substrate and (2) nanocrystals that are evenly distributed on the substrate.

DETAILED DESCRIPTION OF THE INVENTION

The present invention provides a method of preparing aluminum-doped zinc oxide (AZO) nanocrystals. In an exemplary embodiment, the method includes (1) injecting a precursor mixture of a zinc precursor, an aluminum precursor, an amine, and a fatty acid in a solution of a vicinal diol in a non-coordinating solvent, thereby resulting in a reaction mixture, (2) precipitating the nanocrystals from the reaction mixture, thereby resulting in a final precipitate, and (3) dissolving the final precipitate in an apolar solvent. The present invention also provides a dispersion. In an exemplary embodiment, the dispersion includes (1) nanocrystals that are well separated from each other, where the nanocrystals are coated with surfactants and (2) an apolar solvent where the nanocrystals are suspended in the apolar solvent. The present invention also provides a film. In an exemplary embodiment, the film includes (1) a substrate and (2) nanocrystals that are evenly distributed on the substrate.

Method

Figure 1A:
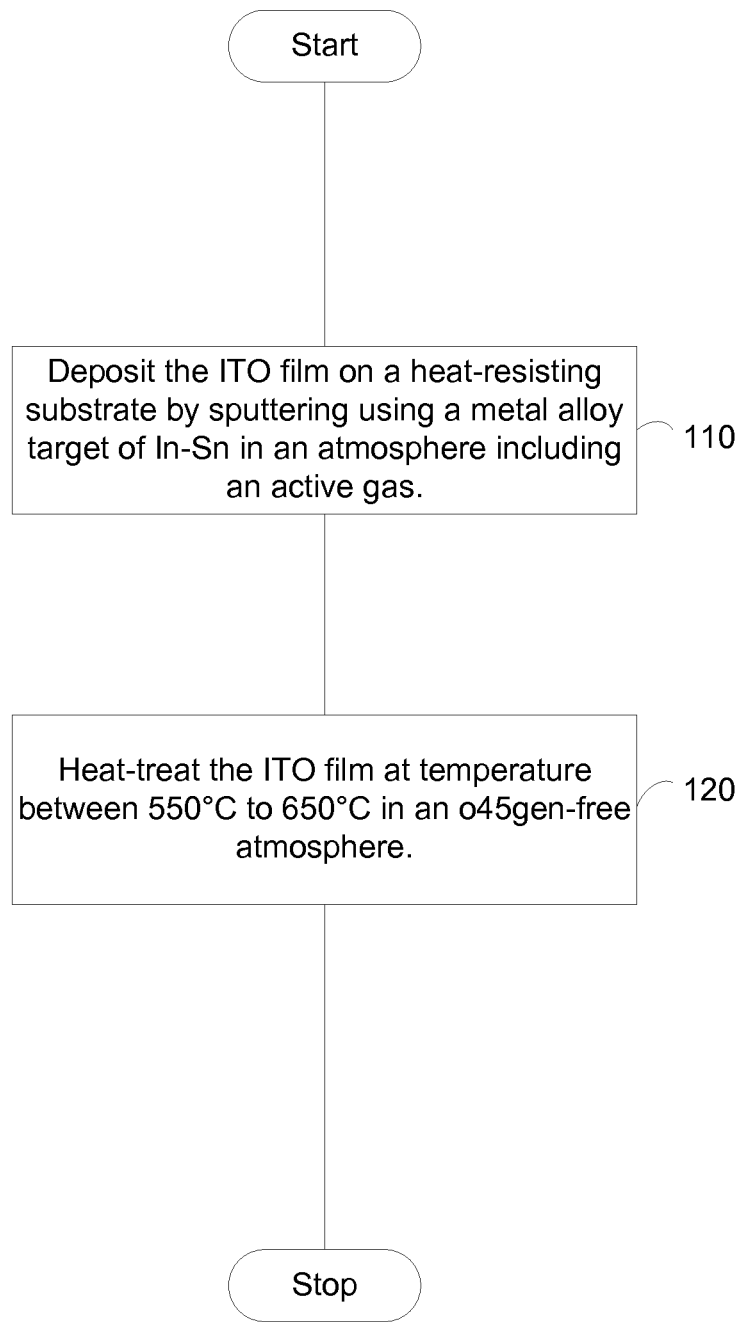
FIG. 1A is a flowchart of a prior art method.
Figure 1B:
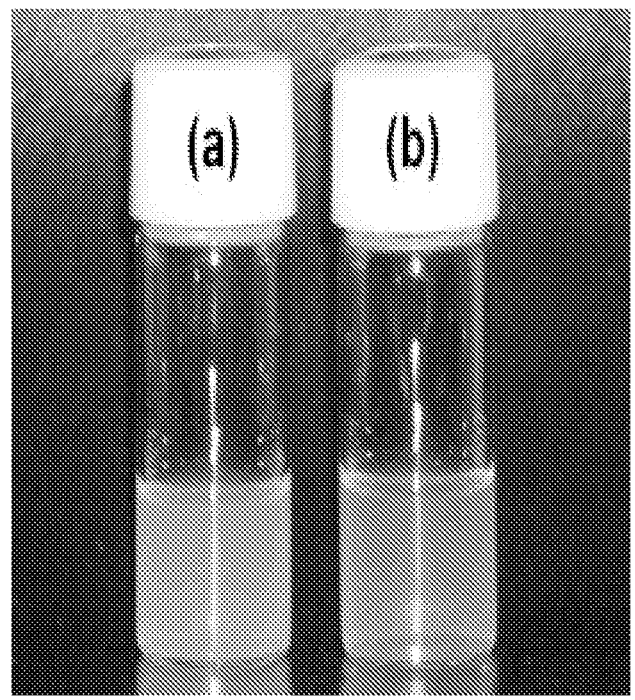
FIG. 1B shows a prior art dispersion.
Figure 1C:
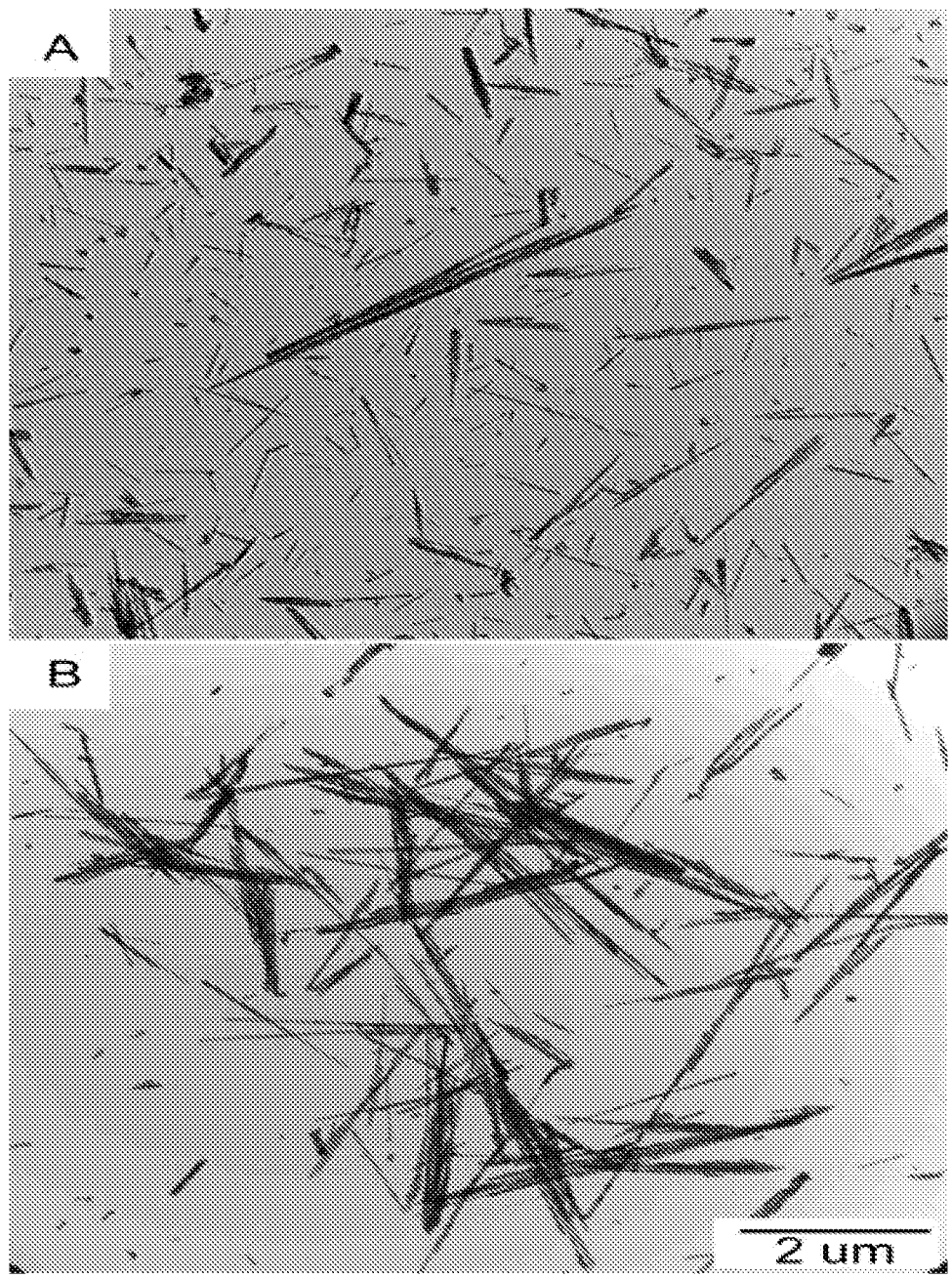
FIG. 1C shows a prior art film.
Figure 2:
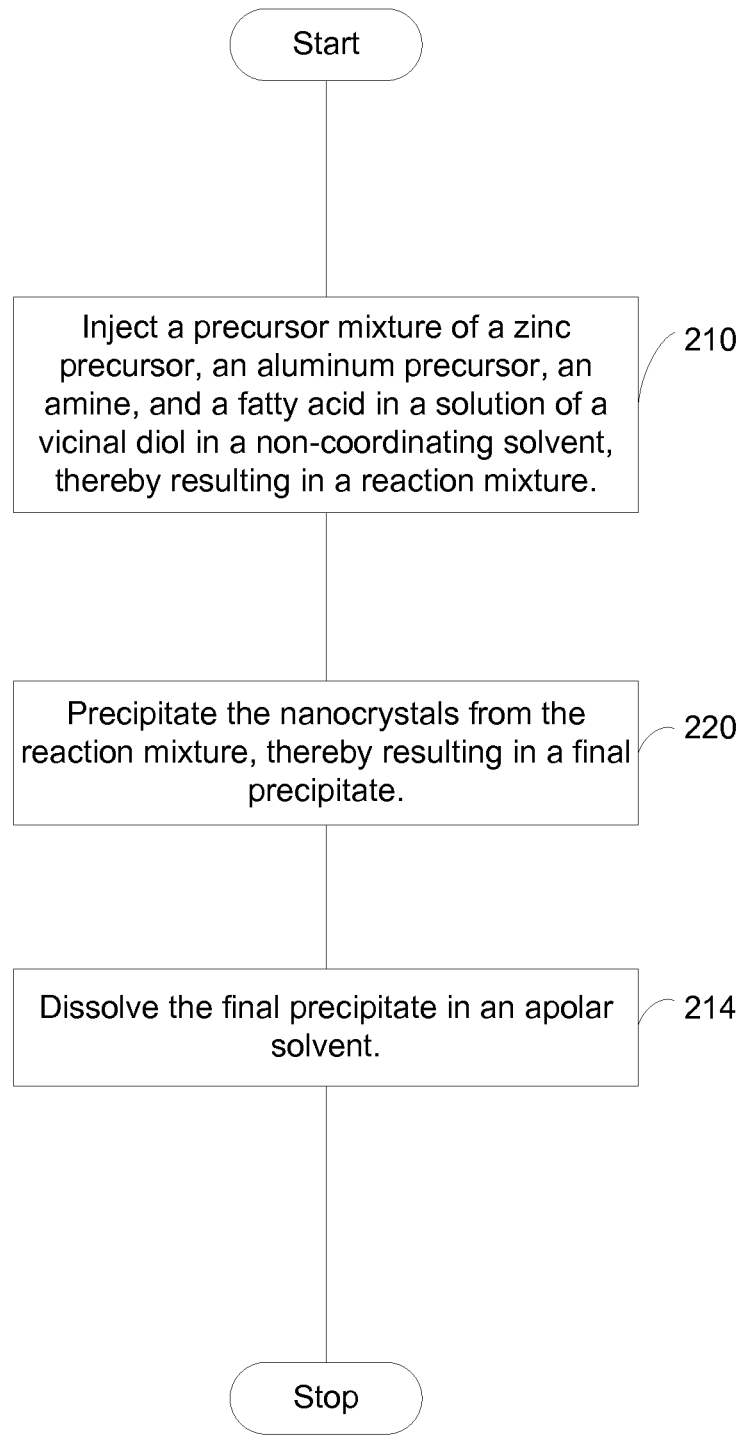
FIG. 2 is a flowchart in accordance with an exemplary embodiment of the present invention.

Referring to FIG. 2, in an exemplary embodiment, the present invention includes a step 210 of injecting a precursor mixture of a zinc precursor, an aluminum precursor, an amine, and a fatty acid in a solution of a vicinal diol in a non-coordinating solvent, thereby resulting in a reaction mixture, a step 220 of precipitating the nanocrystals from the reaction mixture, thereby resulting in a final precipitate, and a step 230 of dissolving the final precipitate in an apolar solvent.

Injecting

Figure 3A:
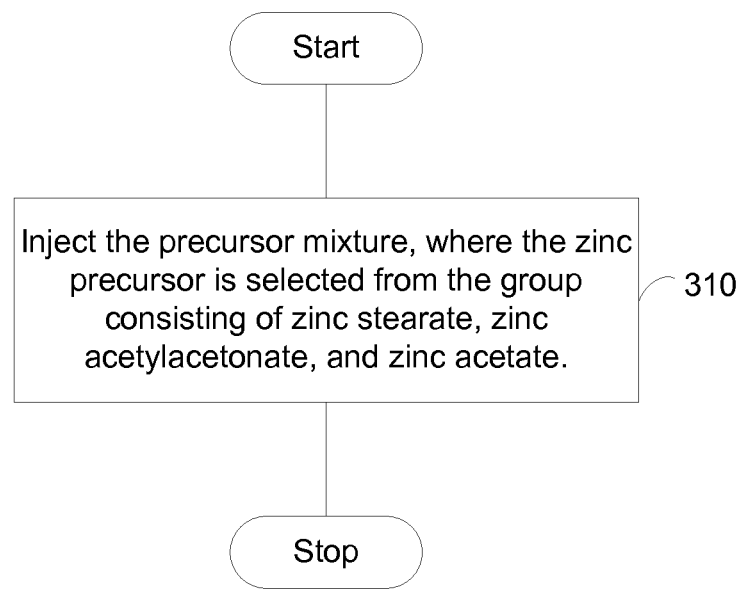
FIG. 3A is a flowchart in accordance with an exemplary embodiment of the present invention.
Figure 3B:
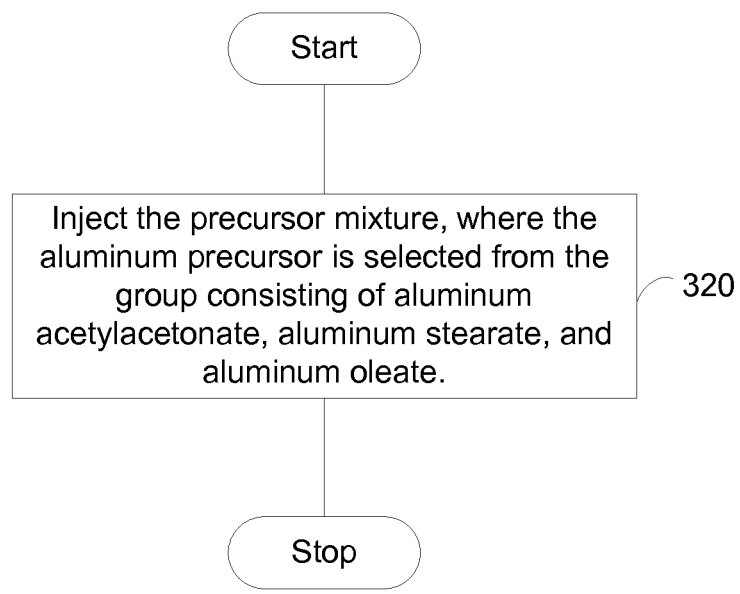
FIG. 3B is a flowchart in accordance with an exemplary embodiment of the present invention.
Figure 3C:
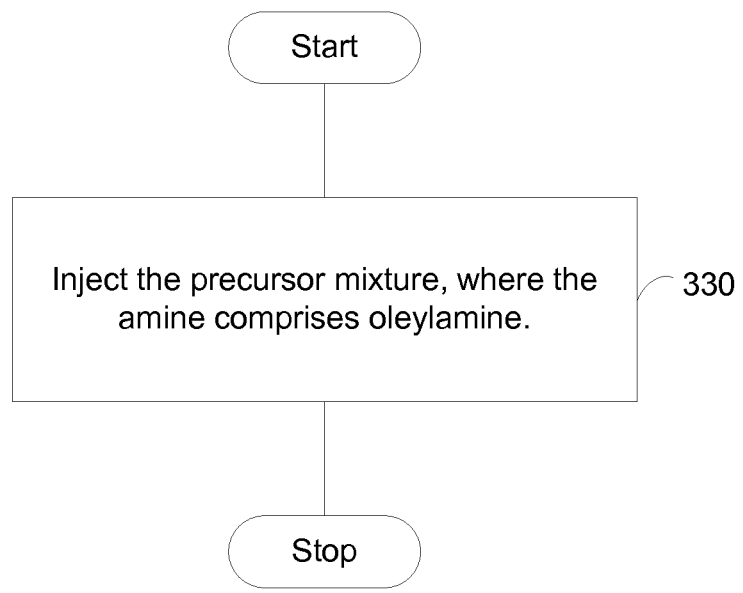
FIG. 3C is a flowchart in accordance with an exemplary embodiment of the present invention.
Figure 3D:
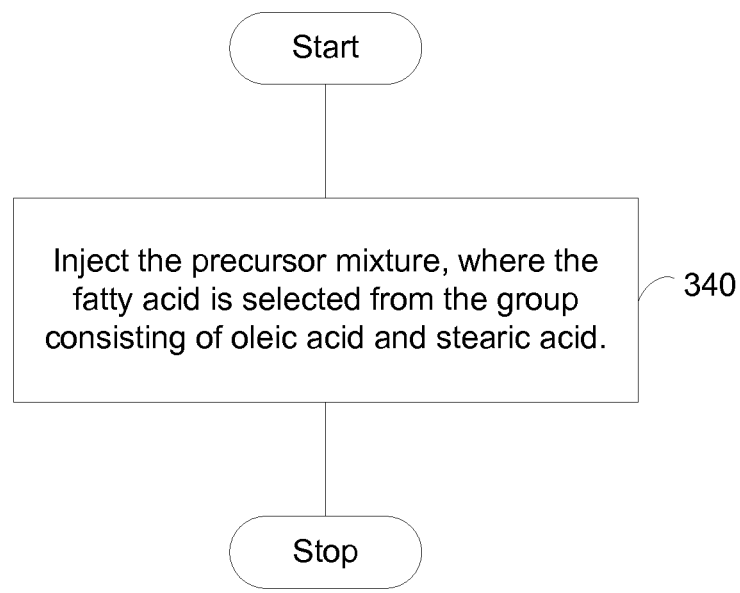
FIG. 3D is a flowchart in accordance with an exemplary embodiment of the present invention.
Figure 3E:
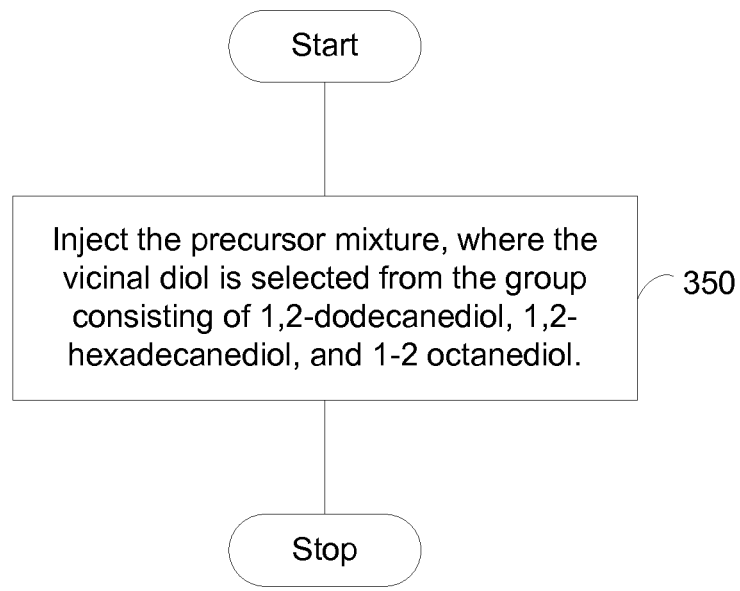
FIG. 3E is a flowchart in accordance with an exemplary embodiment of the present invention.
Figure 3F:
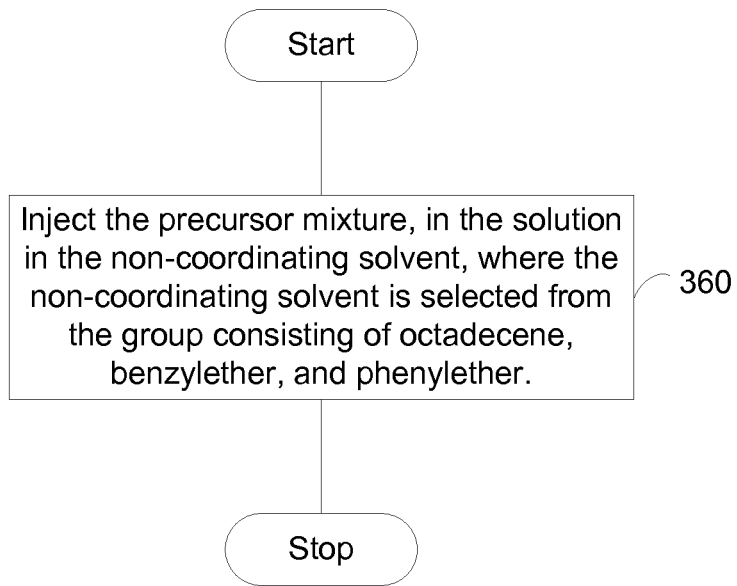
FIG. 3F is a flowchart in accordance with an exemplary embodiment of the present invention.

Referring to FIG. 3A, in an exemplary embodiment, injecting step 210 includes a step 310 of injecting the precursor mixture, where the zinc precursor is selected from the group consisting of zinc stearate, zinc acetylacetonate, and zinc acetate. Referring to FIG. 3B, in an exemplary embodiment, injecting step 210 includes a step 320 of injecting the precursor mixture, where the aluminum precursor is selected from the group consisting of aluminum acetylacetonate, aluminum stearate, and aluminum oleate. Referring to FIG. 3C, in an exemplary embodiment, injecting step 210 includes a step 330 of injecting the precursor mixture, where the amine comprises oleylamine. Referring to FIG. 3D, in an exemplary embodiment, injecting step 210 includes a step 340 of injecting the precursor mixture, where the fatty acid is selected from the group consisting of oleic acid and stearic acid. Referring to FIG. 3E, in an exemplary embodiment, injecting step 210 includes a step 350 of injecting the precursor mixture, where the vicinal diol is selected from the group consisting of 1,2-dodecanediol, 1,2-hexadecanediol, and 1-2 octanediol. Referring to FIG. 3F, in an exemplary embodiment, injecting step 210 includes a step 360 of injecting the precursor mixture, in the solution in the non-coordinating solvent, where the non-coordinating solvent is selected from the group consisting of octadecene, benzylether, and phenylether.

Temperature

Figure 3G:
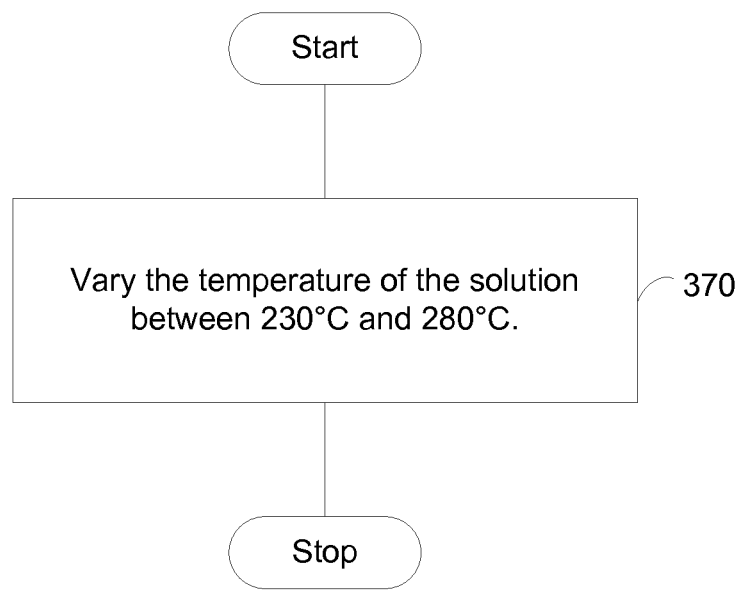
FIG. 3G is a flowchart in accordance with an exemplary embodiment of the present invention.
Figure 3H:
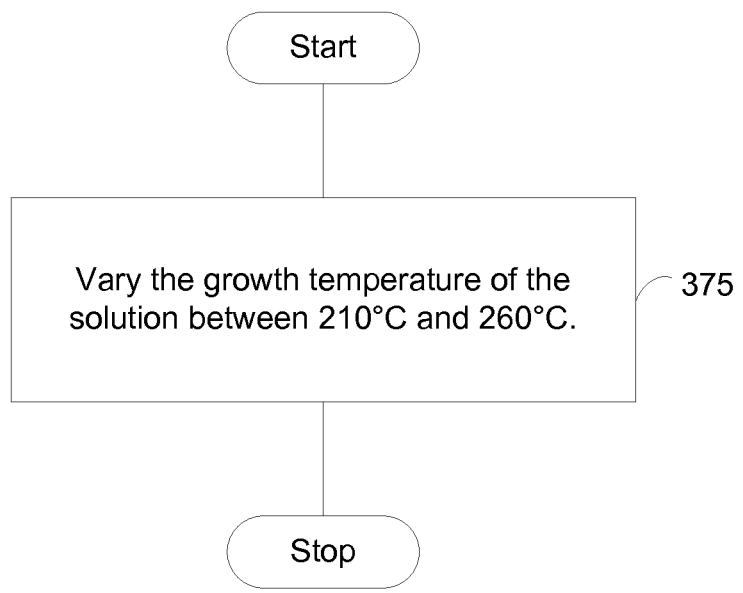
FIG. 3H is a flowchart in accordance with an exemplary embodiment of the present invention.

Referring to FIG. 3G, in an exemplary embodiment, injecting step 210 includes a step 370 of varying the temperature of the solution between 230° C. and 280° C. Referring to FIG. 3H, in an exemplary embodiment, injecting step 210 includes a step 375 of varying the growth temperature of the solution between 210° C. and 260° C.

Time

Figure 3I:
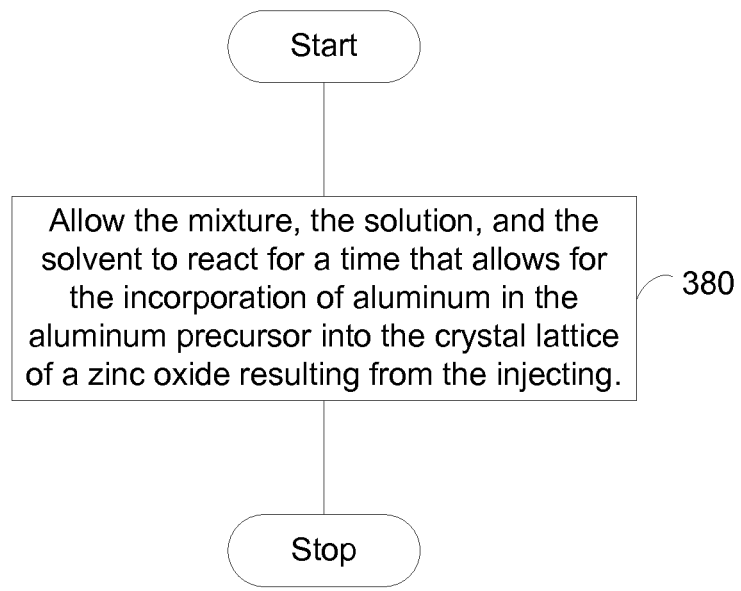
FIG. 3I is a flowchart in accordance with an exemplary embodiment of the present invention.
Figure 3J:
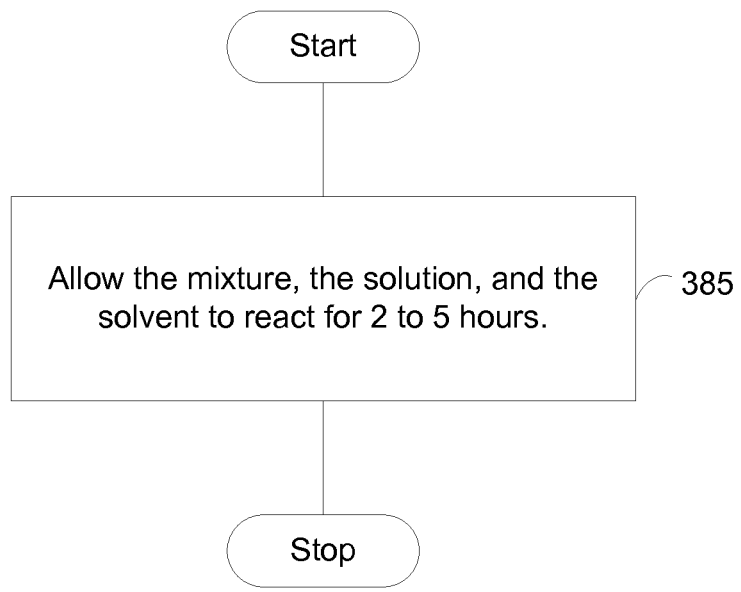
FIG. 3J is a flowchart in accordance with an exemplary embodiment of the present invention.

Referring to FIG. 3I, in an exemplary embodiment, injecting step 210 includes a step 380 of allowing the mixture, the solution, and the solvent to react for a time that allows for the incorporation of aluminum in the aluminum precursor into the crystal lattice of a zinc oxide resulting from the injecting. Referring to FIG. 3J, in an exemplary embodiment, injecting step 210 includes a step 385 of allowing the mixture, the solution, and the solvent to react for 2 to 5 hours.

Precipitating

Figure 4A:
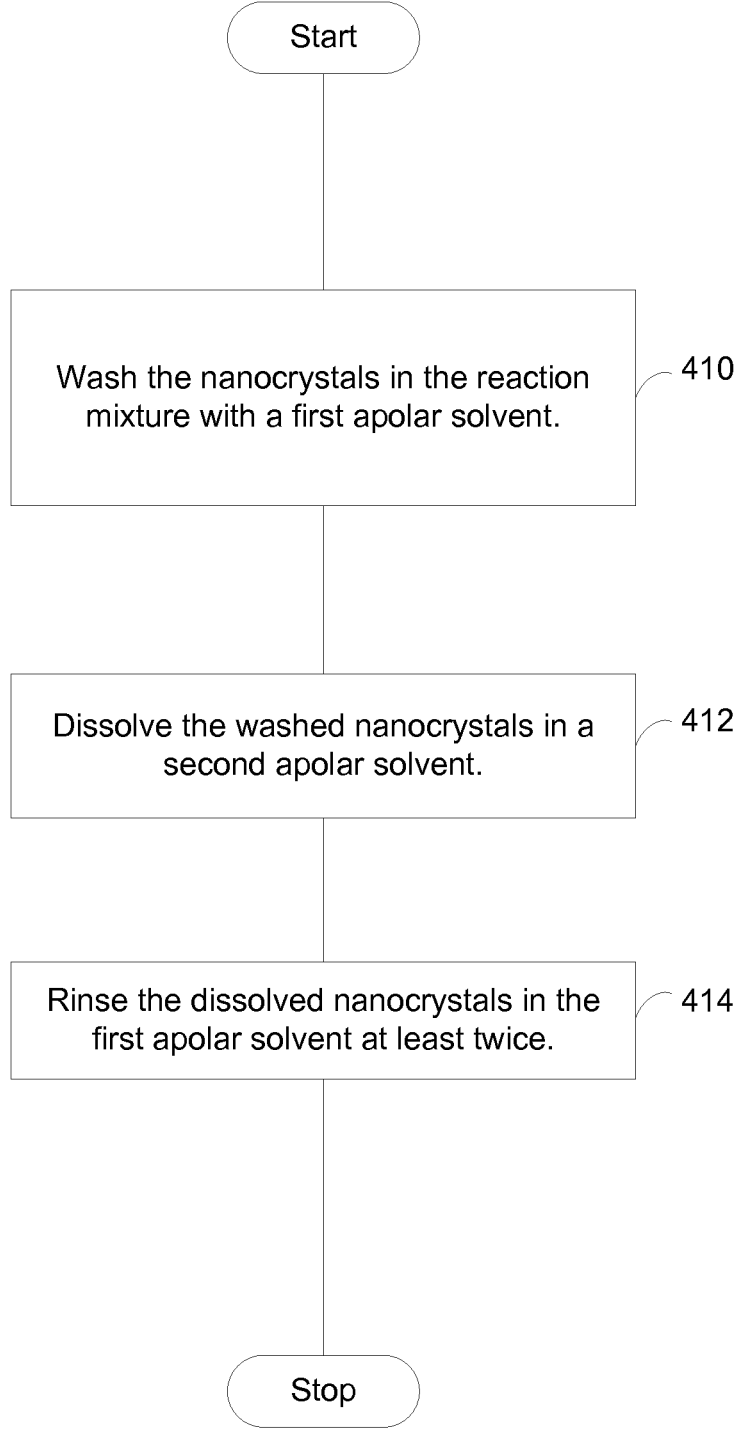
FIG. 4A is a flowchart in accordance with an exemplary embodiment of the present invention.
Figure 4B:
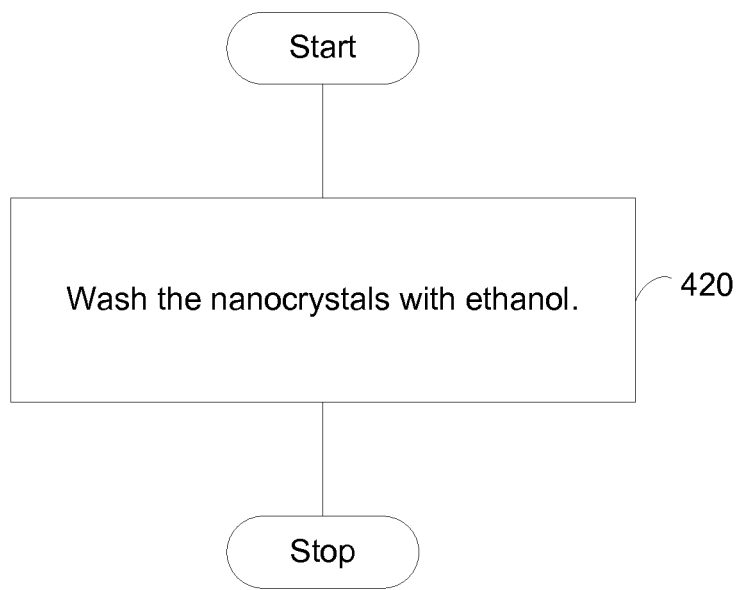
FIG. 4B is a flowchart in accordance with an exemplary embodiment of the present invention.
Figure 4C:
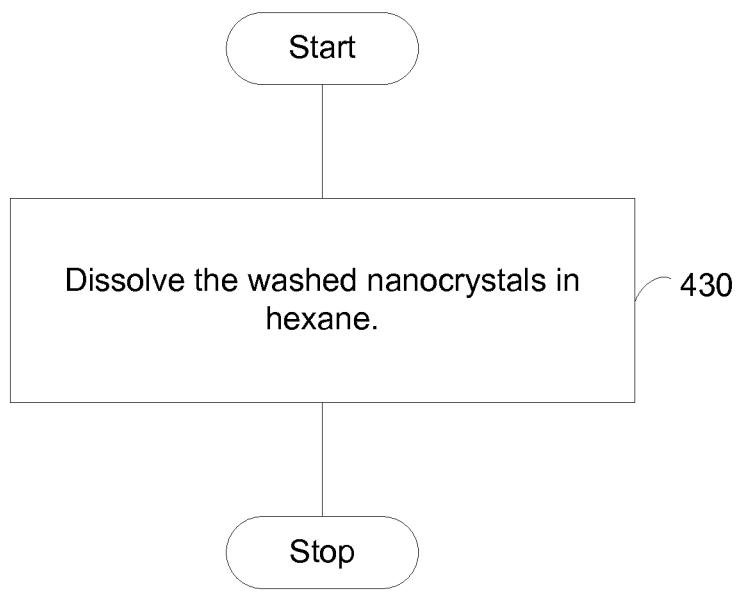
FIG. 4C is a flowchart in accordance with an exemplary embodiment of the present invention.
Figure 4D:
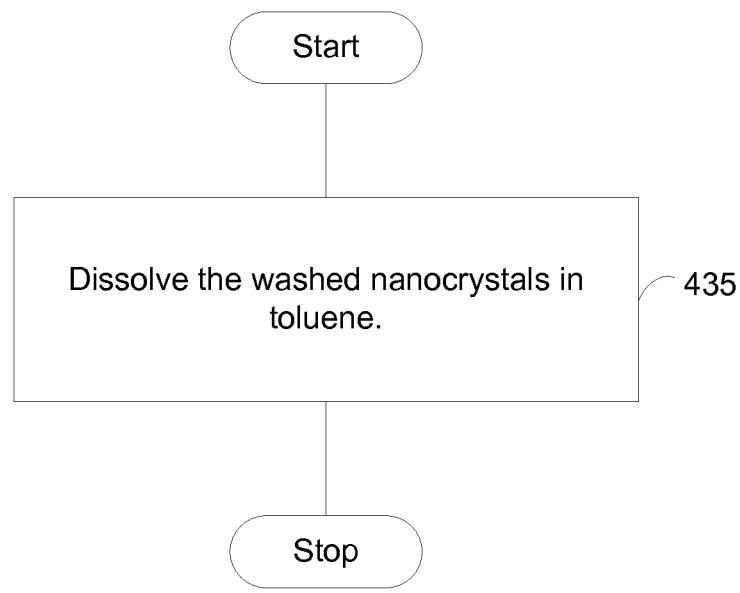
FIG. 4D is a flowchart in accordance with an exemplary embodiment of the present invention.

Referring to FIG. 4A, in an exemplary embodiment, precipitating step 220 includes a step 410 of washing the nanocrystals in the reaction mixture with a first apolar solvent, a step 412 of dissolving the washed nanocrystals in a second apolar solvent, and a step 414 of rinsing the dissolved nanocrystals in the first apolar solvent at least twice. Referring to FIG. 4B, in an exemplary embodiment, washing step 410 includes a step 420 of washing the nanocrystals with ethanol. Referring to FIG. 4C, in an exemplary embodiment, dissolving step 412 includes a step 430 of dissolving the washed nanocrystals in hexane. Referring to FIG. 4D, in an exemplary embodiment, dissolving step 412 includes a step 435 of dissolving the washed nanocrystals in toluene.

Dissolving

Figure 5:
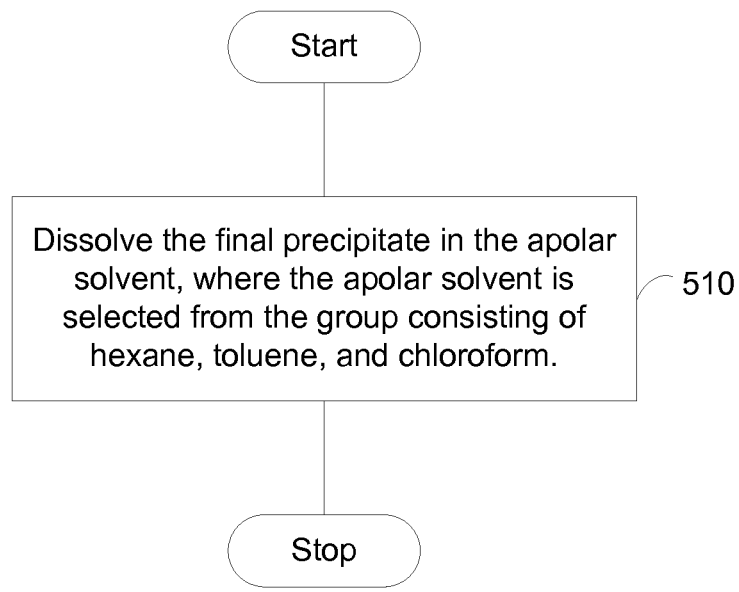
FIG. 5 is a flowchart in accordance with an exemplary embodiment of the present invention.

Referring to FIG. 5, in an exemplary embodiment, dissolving step 230 includes a step 510 of dissolving the final precipitate in the apolar solvent, where the apolar solvent is selected from the group consisting of hexane, toluene, and chloroform.

Depositing

Figure 6A:
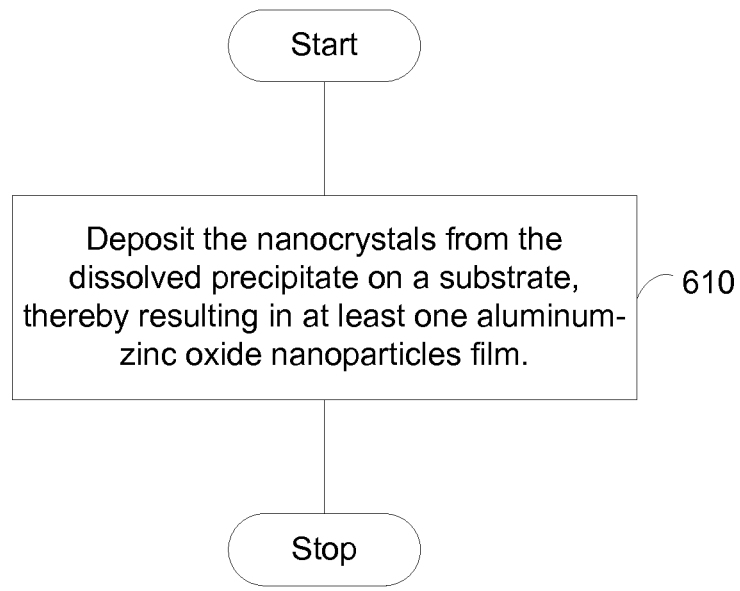
FIG. 6A is a flowchart in accordance with an exemplary embodiment of the present invention.
Figure 6B:
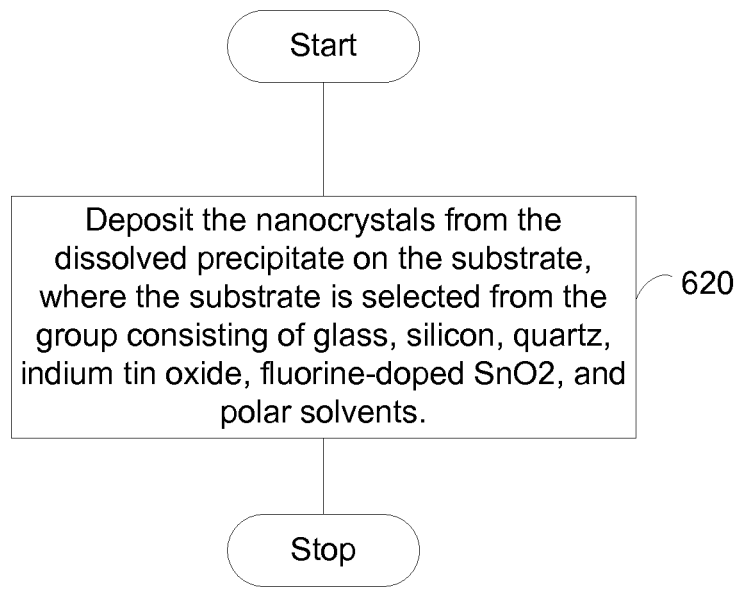
FIG. 6B is a flowchart in accordance with an exemplary embodiment of the present invention.

Referring to FIG. 6A, in a further embodiment, the present invention further includes a step 610 of depositing the nanocrystals from the dissolved precipitate on a substrate, thereby resulting in at least one aluminum-zinc oxide nanoparticles film. Referring to FIG. 6B, in an exemplary embodiment, depositing step 610 includes a step 620 of depositing the nanocrystals from the dissolved precipitate on the substrate, where the substrate is selected from the group consisting of glass, silicon, quartz, indium tin oxide (ITO), fluorine-doped $SnO_2$ (FTO), and polar solvents. In a particular embodiment, the polar solvents repel the fatty acids. In a particular embodiment, the polar solvents are selected from the group consisting of water and glycol.

Removing Organic Ligands

Figure 7A:
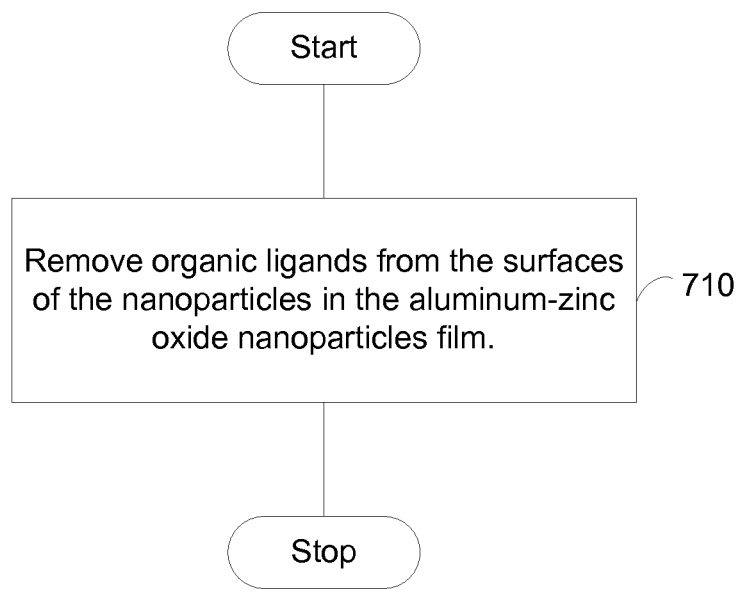
FIG. 7A illustrates a system in accordance with an embodiment of the present invention.
Figure 7B:
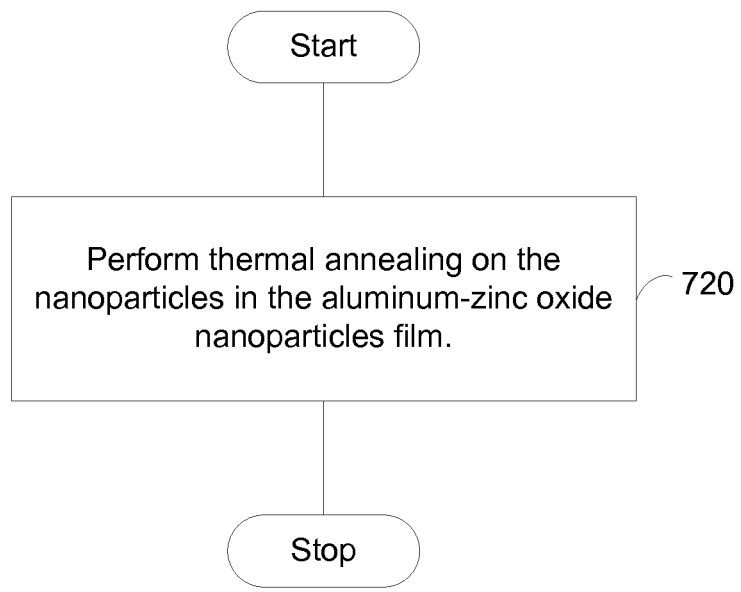
FIG. 7B is a flowchart in accordance with an exemplary embodiment of the present invention.
Figure 7C:
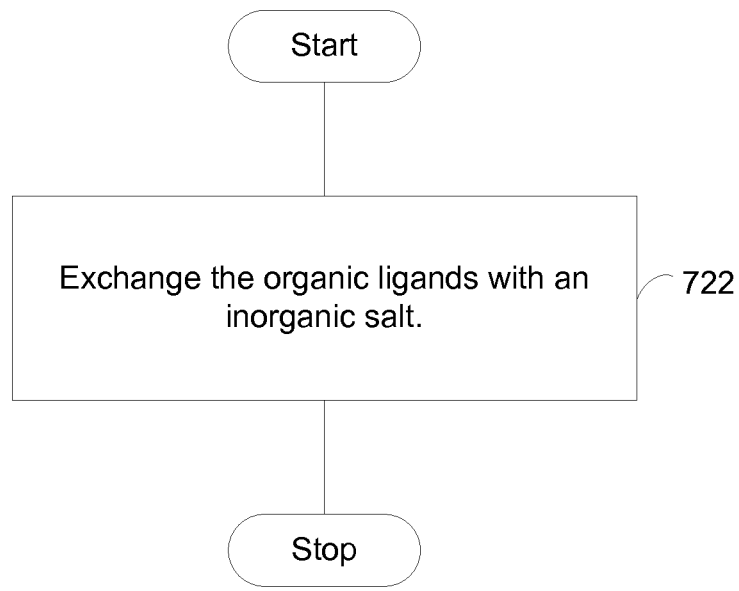
FIG. 7C is a diagram in accordance with an exemplary embodiment of the present invention.
Figure 7D:
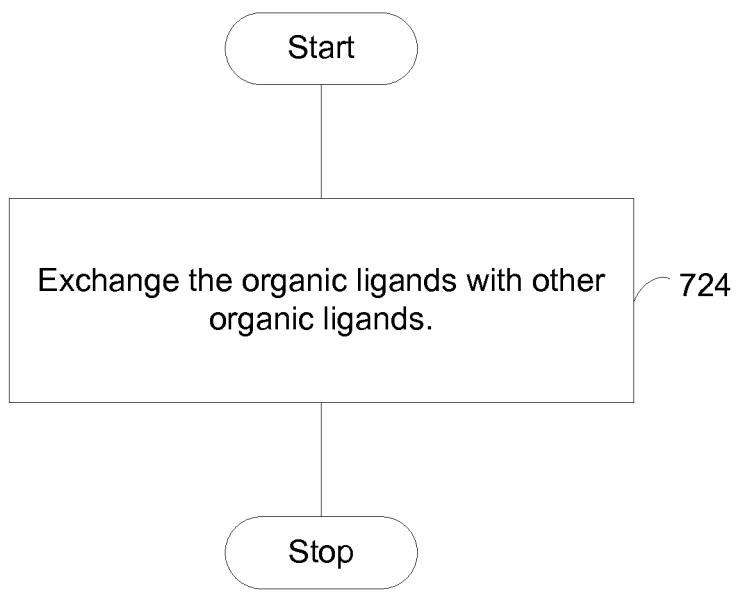
FIG. 7D is a flowchart in accordance with an exemplary embodiment of the present invention.

Referring to FIG. 7A, in a further embodiment, depositing step 610 further includes a step 710 of removing organic ligands from the surfaces of the nanoparticles in the aluminum-zinc oxide nanoparticles film. Referring to FIG. 7B, in a particular embodiment, removing step 710 includes a step 720 of performing thermal annealing on the nanoparticles in the aluminum-zinc oxide nanoparticles film. Referring to FIG. 7C, in a particular embodiment, removing step 710 includes a step 722 of exchanging the organic ligands with an inorganic salt. Referring to FIG. 7D, in a particular embodiment, removing step 710 includes a step 724 of exchanging the organic ligands with other organic ligands.

Dispersion

Figure 8:
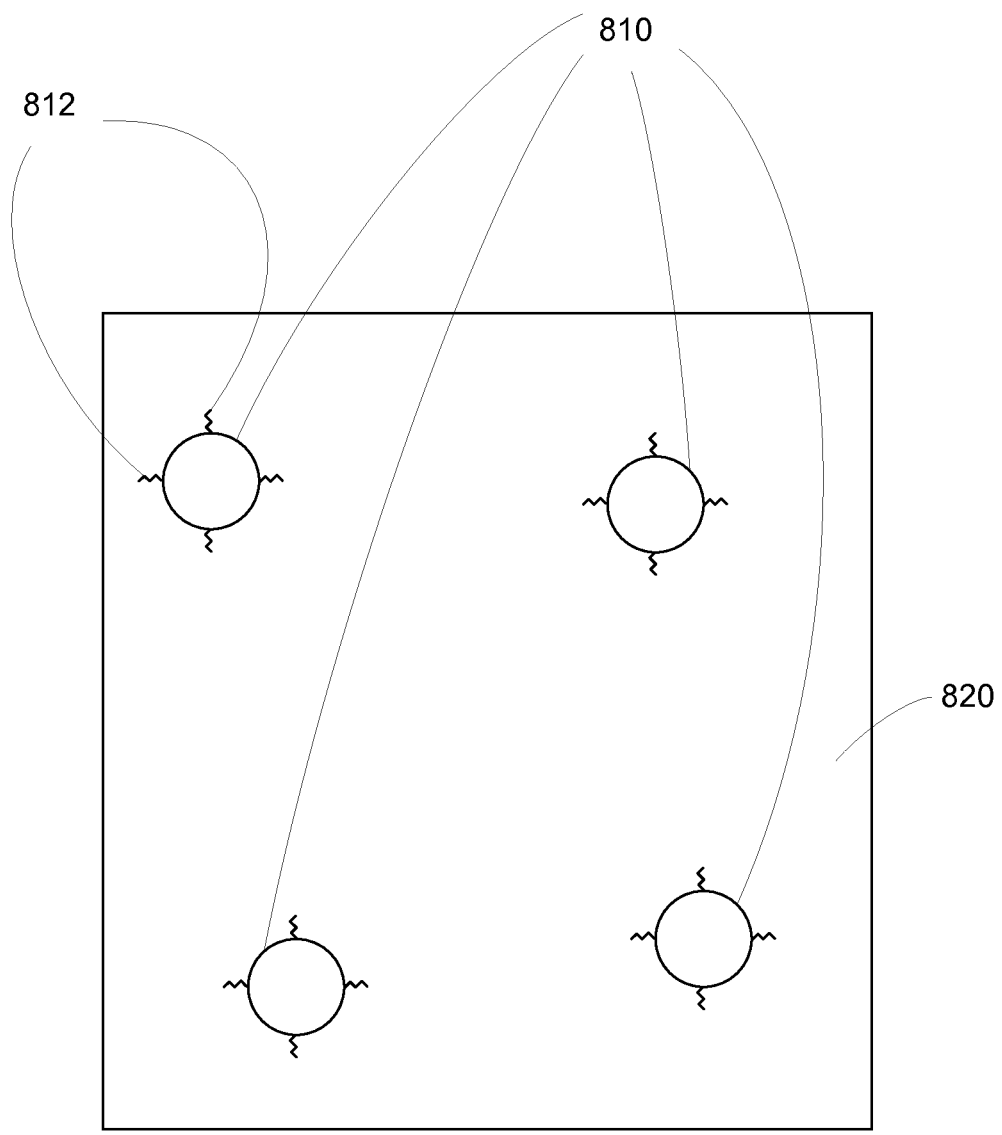
FIG. 8 illustrates a dispersion in accordance with an exemplary embodiment of the present invention.

Referring to FIG. 8, in an exemplary embodiment, the present invention includes a nanocrystals 810 that are well separated from each other, where nanocrystals 810 are coated with surfactants 812 and (2) an apolar solvent 820 where nanocrystals 180 are suspended in apolar solvent 820.

Nanocrystals

In an exemplary embodiment, nanocrystals 810 include aluminum-doped zinc oxide nanocrystals. In an exemplary embodiment, nanocrystals 810 are less than or equal to 50 nm in size.

Surfactants

In an exemplary embodiment, surfactants 812 include fatty acids. In a particular embodiment, the fatty acids are selected from the group consisting of oleic acid and stearic acid.

Apolar Solvent

In an exemplary embodiment, apolar solvent 820 is selected from the group consisting of hexane, toluene, and chloroform.

Film

Figure 9:
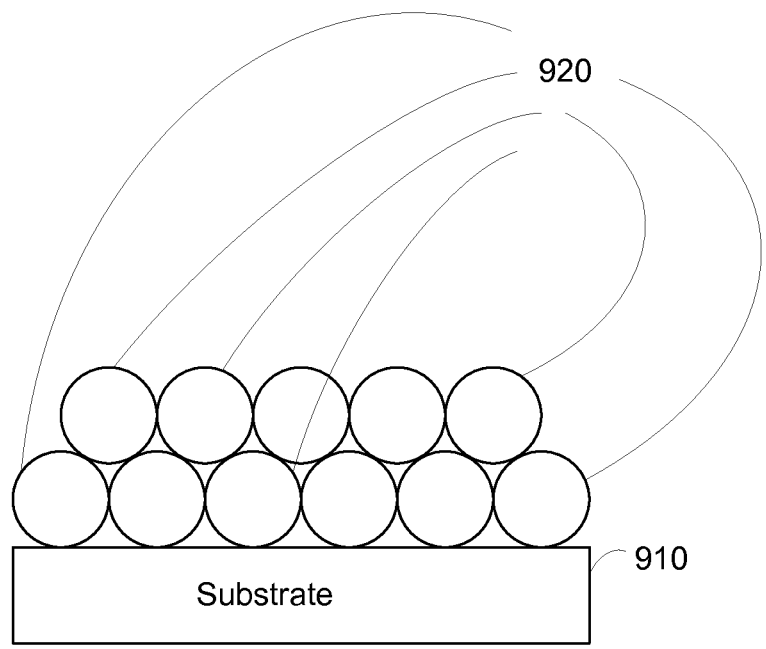
FIG. 9 illustrates a film in accordance with an exemplary embodiment of the present invention.

Referring to FIG. 9, in an exemplary embodiment, the present invention includes a substrate 910 and nanocrystals 920 that are evenly distributed on substrate 910.

Nanocrystals

In an exemplary embodiment, nanocrystals 920 include aluminum-doped zinc oxide nanocrystals. In an exemplary embodiment, nanocrystals 920 are coated with surfactants. In an exemplary embodiment, nanocrystals 920 are less than or equal to 50 nm in size.

Surfactants

In an exemplary embodiment, the surfactants include fatty acids. In a particular embodiment, the fatty acids are selected from the group consisting of oleic acid and stearic acid.

Substrate

In an exemplary embodiment, substrate 910 is selected from the group consisting of glass, silicon, quartz, indium tin oxide, fluorine-doped SnO2, and polar solvents.

General

The present invention allows for the improvement of the performance and the reduction in cost of optoelectronic devices through the integration of nanocrystals (NCs), which can exhibit peculiar size-dependent chemical-physical properties as well as a larger surface area in comparison to their bulk and thin film counterparts.[5,6]

The present invention provides a colloidal wet-chemical approach for preparing highly crystalline AZO NCs showing transparency in the visible, IR reflectance and/or absorption as well as electrical conductivity.

The possibility of using the AZO colloidal nanocrystals as a nanoink via a wet deposition process at low temperature is highly compatible with developing technology of flexible displays and solar cells, based on not high temperature resistant polymeric materials The present invention provides for a method for preparing aluminum-doped zinc oxide nanocrystals is based on colloidal wet-chemical approach. The method includes injecting a mixture of a zinc precursor (zinc stearate, zinc acetylacetonate, zinc acetate), an aluminum precursor (aluminum acetylacetonate, aluminum stearate, aluminum oleate), an amine (typically oleylamine) and a fatty acid (oleic acid, stearic acid) in a hot solution of a vicinal diol (1,2-dodecanediol, 1,2-hexadecanediol, 1-2 octanediol) in a non-coordinating solvent (octadecene, benzylether, phenylether). The temperature of the latter solution varies between 230° C. and 280° C. and the growth temperature between 210° C. and 260° C. The reaction time has to be longer enough to lead to the completion of the reaction and the incorporation of the aluminum in the crystal lattice of the zinc oxide (typically from 2 to 5 hours).

The present invention allows for the control of both the size of the AZO nanocrystals (from 5 nm to 30 nm) and the doping content (from 0.5% to 8% of aluminum) by changing the growth temperature and the amount of the aluminum precursor, respectively. Such size control has not been possible by other reported methods and doping control has been more limited. The size of the AZO nanocrystals has been evaluated on the basis of a statistical analysis on transmission electron microscopy (TEM) images, while the percentage of aluminum by performing both inductively coupled plasma atomic emission spectroscopy (ICP-AES), measurements and energy dispersive X-ray (EDS) analysis.

At the end of the synthetic process, a careful purification of the nanocrystals from the excess of the reagents is carried out. Nanocrystals are precipitated from the reaction mixture by using an apolar solvent (typically ethanol) and then dissolved them in an apolar solvent (typically hexane or toluene) and washed again with ethanol for at least two times. After that, the final precipitate is dissolved and stored in an apolar solvent (hexane, toluene, chloroform). The solution has been found to remain stable for up to one year.

All the AZO nanocrystals show a high degree of crystallinity, as evidenced both by TEM and X-ray diffraction (XRD) analysis, and transparency in the visible range and tunable IR reflectance (depending on the aluminum doping content), as pointed out by the optical spectra. The latter optical properties in the IR have never been showed before for AZO nanomaterials prepared by wet-chemical approaches.

AZO nanoparticles films have been realized by depositing the colloidal nanoparticles from the solution on a substrate (glass, silicon, quartz, ITO or FTO slides). Both spin coating and drop-casting techniques have been employed for this purpose.

To enable electric transport across nanoparticle interfaces, organic ligands on the nanoparticle surface are removed by performing thermal annealing under controlled conditions/atmosphere or by exchanging them with an inorganic salt. These post-deposition processes convert the nanoparticle film into a continuous conductive network although preserving both the nanocrystal features (i.e. size, shape and crystalline phase) and optical properties (transparency in the visible and tunable reflectance in the IR).

These properties make the AZO colloidal nanoparticles prepared by our method very appealing for practical applications in flat displays, solar cells and smart windows.

The present invention provides for the careful manipulation of the reaction condition. Such manipulation can allow for the achievement of a high level of control on both the size and the doping content of AZO NCs. The present invention provides a growth mechanism proposed which is consistent with FT-IR measurements. The NC chemical and structural identity has been investigated by a combination of different techniques such as powder X-ray Diffraction (XRD), high resolution transmission electron microscopy (HRTEM) analysis, energy dispersive spectroscopy (EDS), inductively coupled plasma atomic emission spectroscopy (ICP-AES). Optical properties have been assessed by UV-VIS-NIR absorption spectroscopy.

Uses

AZO colloidal NCs are promising for application requiring transparent conductive oxide such as flat displays, solar cells and electrochromic windows.

Zinc is a very abundant and low cost materials in comparison to indium used for ITO materials.

In addition, AZO nanocrystals represent a valid and cheaper alternative to AZO thin films prepared by other techniques, such as sputtering or evaporation. Moreover, NCs have the advantage over sol-gel technique that they are already crystalline before depositing the film, allowing low temperature deposition processes, highly compatible with the use of plastic substrates.

All these benefits coming with AZO colloidal nanocrystals could be appealing for commercial manufacturing interested in TCO thin films for all the wide range of applications they are used.

EXAMPLE

The present invention will be described in greater detail by way of a specific example. The following example is offered for illustrative purposes, and is intended neither to limit nor define the invention in any manner.

Dispersion

Materials and Methods

In accordance with an exemplary embodiment of the present invention, AZO nanocrystals were synthesized with simultaneous control of nanocrystal size and doping level. Reactivity of aluminum (Al) and zinc (Zn) precursors was balanced by rational selection of coordinating ligands to facilitate tuning the Al content from 0 to 8% while achieving size control between 5 and 20 nm by changing the growth temperature. Effective dopant incorporation was demonstrated by tracking free carrier absorption in the infrared region.

In a typical synthesis, in accordance with an exemplary embodiment of the present invention, performed under argon, a precursor solution containing zinc stearate ($ZnSt_2$, 1 mmol), aluminum acetylacetonate ($Al(acac)_3$, 0.05-0.5 mmol), and oleic acid (OLAC, 3 mmol) in 4 mL of octadecene (ODE) was injected at high temperature (230° C.-260° C.) into a three-neck flask containing 1,2-hexadecanediol (HDDIOL, 10 mmol) in 11 mL of octadecene (ODE). The temperature dropped ($\Delta T=20°$ C.) following injection, and the reaction mixture was held at this lower temperature for five hours, resulting in a narrow size dispersion of AZO NCs. By contrast, including all the reagents in the flask and slowly heating this mixture from room temperature resulted in highly polydisperse NCs. The NCs were collected by centrifugation, washed with ethanol and redispersed in a nonpolar solvent, such as hexane, toluene or chloroform.

Results

Figure 10:
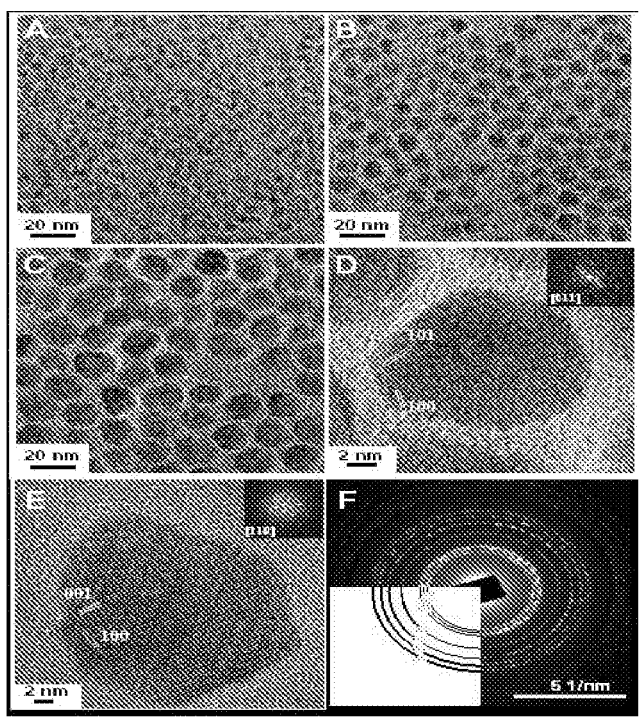
FIG. 10 shows images in accordance with an exemplary embodiment of the present invention.

The size, shape and crystallinity of the AZO NCs were assessed by both low- and high-resolution transmission electron microscopy (TEM), as shown in FIG. 10. FIG. 10 shows low- and high-resolution TEM of AZO NCs. As shown in FIG. 10A, FIG. 10B, and FIG. 10C, AZO NCs of different sizes were obtained by injecting precursor solutions containing 0.2 mmol of $Al(acac)_3$ at 230° C., 240° C. and 260° C., respectively.

FIG. 10D shows a HRTEM image of a pseudo-spherical AZO NC oriented along the [011] zone axis and the corresponding Fast Fourier Transform (FFT) in the inset indicating the hexagonal structure of the wurtzite. The lattice fringes correspond to a spacing of 2.42 Å and 2.79 Å derived from FFT which match well the d spacing of the (101) ($d_{ZnO}^{101}=2.47$ Å) and (100) planes ($d_{ZnO}^{100}=2.81$ Å) of wurtzite ZnO.

FIG. 10E shows a HRTEM image of a bullet-shaped AZO NC oriented along the [110] zone axis and the corresponding FFT in the inset. The lattice fringes correspond to 2.79 Å and 2.58 Å, derived from FFT, consistent with the (100) and the (001) ($d_{ZnO}^{001}=2.60$ Å) planes, respectively, of wurtzite ZnO. FIG. 10F shows an Electron Diffraction of AZO NCs with the expected wurtzite pattern indicated in the lower left.

Depending on the injection temperature, for a fixed $Al(acac)_3:ZnSt_2$ molar ratio, different sizes can be obtained (FIG. 10A-FIG. 10C). AZO NCs with a diameter of 5 nm, 10 nm and 15 nm with a standard deviation within 15% and an isotropic shape were obtained at 230° C., 240° C., 260° C., respectively, for $Al(acac)_3:ZnSt_2$ 1:5, as show in FIG. 10A-FIG. 10C. High resolution TEM analysis of typical NCs revealed that they were single crystalline with pseudo-spherical or bullet-like shapes, as shown in FIG. 10D-FIG. 10E. The lattice fringes matched well the hexagonal wurtzite phase of ZnO, which was confirmed by electron diffraction, as shown in FIG. 10F). No structural defects were apparent as a consequence of doping.

In order to evaluate dopant incorporation, the aluminum content of the AZO NCs was assessed by elemental analysis, performed with an inductively coupled plasma-atomic emission spectrometer (ICP-AES), as shown in Table 1. The composition determined by elemental analysis was in close agreement with that obtained by energy-dispersive x-ray spectroscopy (EDX) performed on individual NCs. Thus, the Al detected by ICP-AES analysis was indeed that incorporated into the NCs and not due to excess aluminum precursor or other species in solution.

TABLE 1

| $T_{inj}/$ $T_{growth}$(° C.) | Al(acac)$_3$ (mmol)$^a$ | Al atomic % |
|---|---|---|
| 260/240 | 0.2 | 7.3 |
| 240/220 | 0.2 | 5.5 |
| 230/210 | 0.2 | 4.4 |
| 230/210 | 0.05 | 1.4 |
| 230/210 | 0.1 | 3.5 |
| 230/210 | 0.3 | 5.2 |
| 230/210 | 0.5 | 6.2 |
| 230/210 | 1 | 20 |

$^a$The amount of ZnSt$_2$ is constant at 1 mmol.

Table 1 shows ICP-AES analysis of AZO NCs synthesized at different temperatures and metal precursor.

Increasing the aluminum precursor concentration in the growth medium, for a fixed injection temperature, resulted in greater Al incorporation, as shown in Table 1, into the NCs, while contributing to NC size (even if with less extent than temperature) and shape change. Growth temperature also played a critical role in terms of doping content. In particular, for a fixed Al(acac)$_3$:ZnSt$_2$ molar ratio, more Al was incorporated into the NC lattice at higher reaction temperatures. This trend was contrary to that expected on the basis of self-purification since diffusion of dopants to the surface would be enhanced at higher temperatures corroborating the main role played by kinetics versus thermodynamics also in these doped metal oxide nanocrystals.[15-19] Instead, it highlighted the importance of reaction kinetics for controlling dopant incorporation although, owing to the complexity of the reaction system, it is difficult to propose a complete explanation of the effect of temperature. Nonetheless, further insight into the interplay between growth kinetics and doping was found by investigating the growth mechanism and by making systematic variations in the coordinating ligands of the metal precursors.

By Fourier transform infrared spectroscopy (FTIR), it was found that esters were a byproduct of the NC growth reaction, indicating that an alcoholysis reaction took place. Specifically, the carbonyl groups of the ZnSt$_2$ can undergo nucleophilic attack by HDDIOL to form esters. Polycondensation reaction of the resulting hydroxylated zinc precursors subsequently produces a nanocrystalline [Zn—O]$_n$ network. The predominant role of HDDIOL in the growth mechanism was confirmed by the lack of any recoverable product when HDDIOL was omitted from the reaction mixture. Also, when less sterically hindered shorter-chain diols were substituted, highly anisotropic shapes were obtained, consistent with a more rapid crystal growth.[20]

Considering that alcoholysis dominates the reaction pathway, the rate of monomer addition to the growing NCs could be tuned by varying the coordinating ligands to the metals. Since Al$^{3+}$ is a harder Lewis acid than Zn$^{2+}$, an aluminum precursor with the same carboxylate ligands as Zn$^{2+}$ should have been much less reactive. Indeed, far less Al incorporation was observed when a more reactive Zn precursor, such as zinc acetate or zinc acetylacetonate, was substituted for ZnSt$_2$. Likewise, when AlSt$_3$ was used in place of Al(acac)$_3$, no doping was achieved. While FTIR suggests that OLAC partially substitutes the acac ligands of Al, in addition to act as a passivating ligand at the AZO surface, the Al precursor remained sufficiently reactive to introduce appreciable doping at the slow growth rates enforced by employing a ZnSt$_2$ precursor.

The structural implications of dopant incorporation in the AZO NCs were probed by x-ray diffraction (XRD), as shown in FIG. 11A. At all doping levels, the patterns were readily assigned to the wurtzite phase, with no other crystalline phases, such as aluminum oxide (Al$_2$O$_3$) or gahnite (ZnAl$_2$O$_4$) which are common secondary phases in AZO thin films, emerging.[11,13] In each case, the line broadening in the Bragg peaks was consistent with coherent domain sizes at the nanoscale. In addition, there were no significant alterations in the relative intensity compared to the standard wurtzite pattern, in agreement with the isotropic shape observed by TEM.

FIG. 11A shows X-ray diffraction patterns and FIG. 11B shows variation of lattice parameters derived from Rietveld analysis for AZO NCs with different Al content. The reference diffraction pattern of bulk wurtzite is shown at the bottom of FIG. 11A (JPCD 5-0664).

Refining structural and microstructural paramenters by Rietveld analysis, the lattice parameters, domain sizes and inhomogenous lattice strain of the AZO NCs of the present invention, and of undoped ZnO for reference were obtained. As generally observed for metal oxide NCs, the ZnO lattice expanded slightly as size decreases.[21] Furthermore, comparing AZO NCs to ZnO NCs of similar size, the lattice contracted with increasing Al incorporation, as shown in FIG. 11B. This is consistent with the substitution of smaller Al$^{3+}$ ions (radius 0.53 Å) on Zn$^2$ (radius 0.74 Å) lattice sites. By contrast, interstitial Al$^{3+}$ should have induced lattice expansion.[12,13] While the lattice contracted along both the a and c axes of the hexagonal wutzite unit cell, the c axes varied to a greater extent, particularly at lower doping levels, perhaps due to some preferential site occupation of the Al. Moreover, the incorporation of Al in the lattice induced a substantial increase of the inhomogeneous strain in doped.

Figure 12:
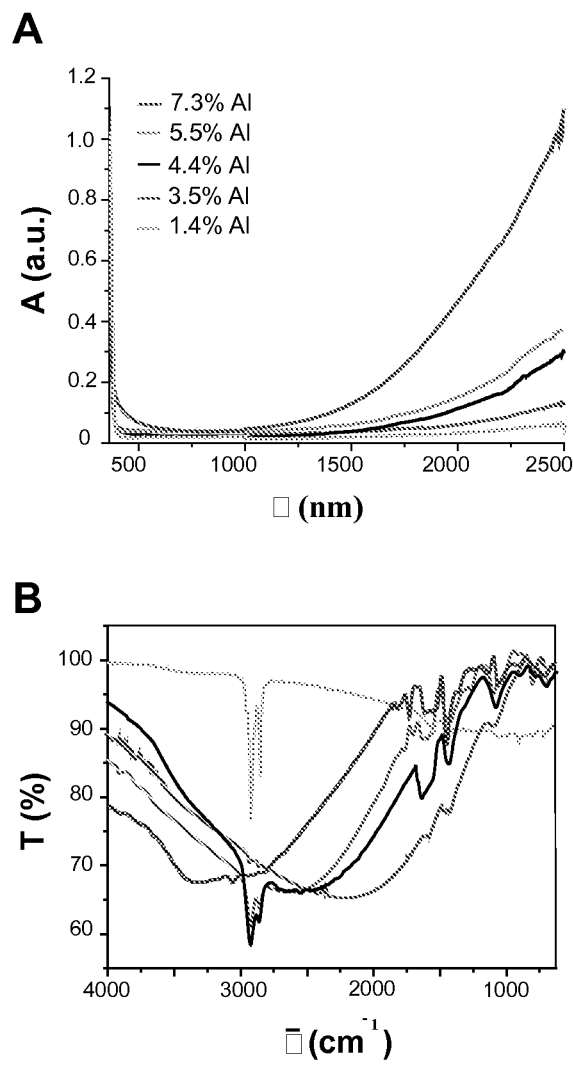
FIG. 12 is a plot in accordance with an exemplary embodiment of the present invention.

The efficacy of doping towards the generation of free carriers could be directly assessed from the optical properties of the NCs. The appearance of absorption in the infrared region (IR) was a clear signature of n-doping and could be attributed to surface plasmon absorption in the case of AZO.[22,6,7] As the Al doping concentration was increased from 1.4 to 7.3%, the IR absorption increased monotonically, as shown in FIG. 12A. As shown in FIG. 12B, the absorption peak shifted systematically to higher energy with increasing Al content. The extinction at the low energy edge of the absorption peaks diminished at higher doping levels, contrary to the spectral characteristics expected for filling of localized trap states. These optical properties strongly evidenced that the IR absorption was, in fact, surface plasmon absorption, and that the Al occupied substitutional sites, effectively creating free electrons in the NCs.[11-14]

Figure 11:
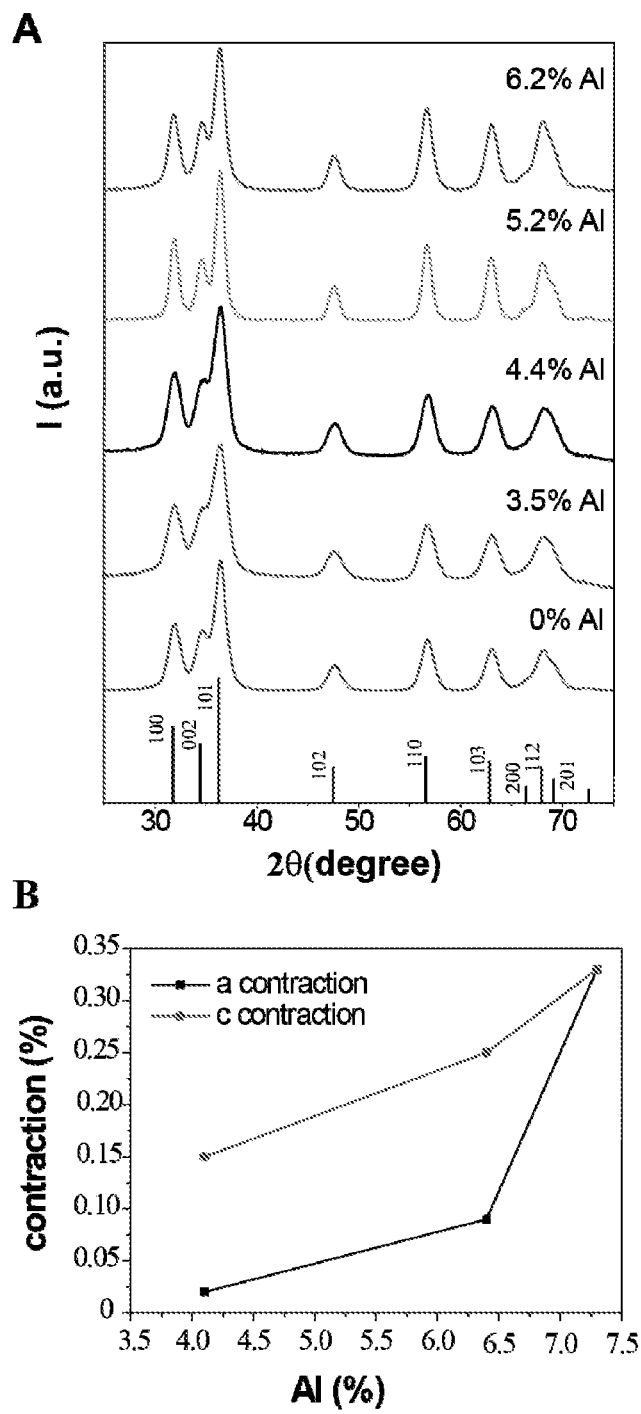
FIG. 11 shows plots in accordance with an exemplary embodiment of the present invention.

FIG. 11 shows optical properties of AZO NCs in accordance with the present invention. FIG. 11A shows Vis-NIR absorbance and FIG. 11B shows FTIR spectra of equimolar dispersion of AZO NCs containing varying degrees of Al doping. The additional sharper peaks in the FTIR spectra come from the organic ligands present on the surface of the nanoparticles.

Free electrons introduced by doping accumulated in the conduction band, which should have caused an increase of the optical band gap, known as the Burstein-Moss effect, besides the surface plasmon absorption in the IR.[23-25] The optical band gaps ($E_{g\ opt}$) of AZO NCs with different aluminum content were determined from linear fits to plots of $(\alpha h\nu)^2$ versus the photon energy (hν extrapolating to α=0, since ZnO is a direct band gap semiconductor.[26] The resulting values were compared to undoped ZnO NCs of similar size in order to exclude any contribution of quantum confinement, as shown in Table 2.

TABLE 2

| Al % | $E_{g\ opt}$ (eV) |
|---|---|
| 0 | 3.32 |
| 1.4 | 3.37 |
| 3.5 | 3.38 |
| 4.4 | 3.39 |
| 6.2 | 3.50 |
| 7.3 | 3.54 |

Table 2 shows extrapolated optical band gaps for AZO NCs with different aluminum content.

The progressive blue shift of the bandgap was another clear indication of effective Al doping.[23-25] Again, this effect was clearly observable owing to the high quality and uniformity of our AZO NCs.

Even at the higher doping levels, the NCs remained highly transparent across the visible region. However, attempting to further increase the doping level beyond 8% resulted in scattering in the visible region with no further increase in IR absorption. These nanoparticles appeared larger by TEM, yet the crystallite size determined by XRD was not substantially increased. Rather than increasing the substitutional dopant concentration, it might have been that domains of an amorphous material, such as $Al_2O_3$, are forming when the concentration of aluminum precursor is very high.

Film

Materials and Methods

Finally, for many applications, it may be necessary to deposit the NCs as a film while preserving the optical and electronic properties. In accordance with an exemplary embodiment of the present invention, AZO NCs were drop-casted from a dispersion in 85:15 hexane:octane, resulting in very uniform films, as shown in FIG. 13A-FIG. 13C. There was no scattering, the films were completely transparent in the visible and a prominent surface plasmon peak in the IR region indicates that effective doping is preserved, as shown in FIG. 13D.

Results

Figure 13:
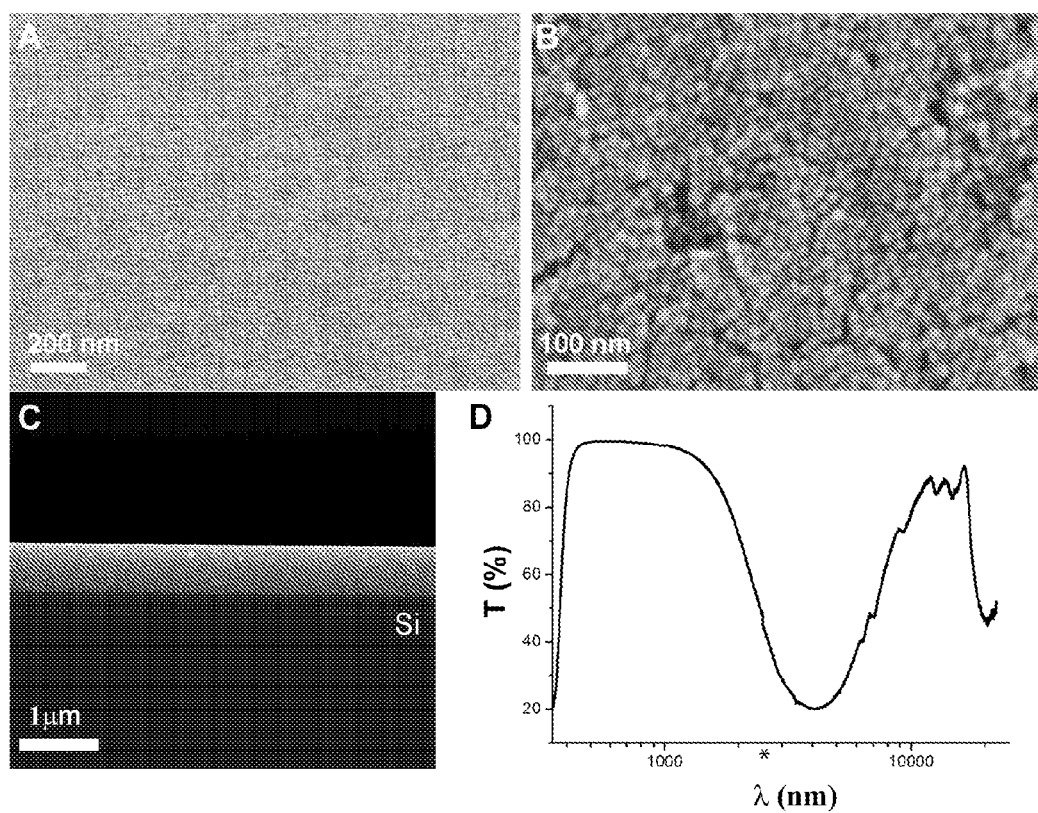
FIG. 13 shows images in accordance with an exemplary embodiment of the present invention.

FIG. 13 shows morphological and optical characterization of a thin film of 15 nm AZO NCs with a 7.3% Al content. FIG. 13A shows low- and FIG. 13B shows high-magnification top-view scanning electron microscopy (SEM) images, while FIG. 10C shows a cross sectional-view SEM image of the AZO film deposited on silicon. FIG. 10D shows transmittance of the AZO film. This wide range spectrum was obtained by combining a spectrum from 350 nm to 2500 nm of a film deposited on quartz, recorded by a Visible/NIR spectrophotometer, with a spectrum from 2500 nm to 25000 nm of a film deposited on silicon, acquired by FTIR. The peak at long wavelength (20235 nm) corresponds to the Zn—O vibration. The symbol (*) on the x-axis indicates the junction point between the two spectra.

General

A rational selection of precursors and reaction conditions made possible the manipulation of the ZnO NC growth rate in order to obtain monodisperse particles with different sizes simultaneously with effective Al doping in accordance with an exemplary embodiment of the present invention. The NC size and IR absorption, related to the number of Al atoms incorporated in the nanocrystals, both increased over the course of the reaction time, which suggested that dopants may be excluded from the initial nuclei and only incorporated as growth progresses.[16-18] The radial inhomogeneous distribution of the dopants emerged also from energy-dependendent XPS data and could have accounted for the large inhomogeneous strain found by Rietveld analysis. The uniformity and dispersibility of the present invention's AZO NCs allowed observation of a distinct surface plasmon feature, tunable by varying the doping level. This result could open up the way both to fundamental studies toward a deeper understanding of the influence of the free electrons on the properties of metal oxide nanocrystals, and to promising practical applications for AZO NCs.[22] In particular, AZO NCs could be used as a lower cost and more-environmental friendly alternative to ITO NCs in a wide range of applications, from displays and smart windows to even bioelectronic devices.[10] Moreover, the present invention provides the tunability of surface plasmon absorption in the NIR for AZO NCs. Thus, such AZO NCs could be used in more specific optical-based application, such as waveguide modulators and switches at telecommunication wavelengthhs.[28]

Preparation of AZO Nanocrystals

In accordance with an exemplary embodiment of the present invention, a solution (A) containing $ZnSt_2$ (Alfa Aesar, 1 mmol), $Al(acac)_3$ (Aldrich 99%, 0.05-1 mmol), OLAC (Aldrich 90%, 3 mmol) in 4 mL of ODE (Aldrich 90%) and a mixture (B) of 1,2-HDDIOL (Aldrich 90%, 10 mmol) in 11 mL ODE were loaded in three-neck flasks and magnetically stirred at 140° C. under argon for 1 h. Afterward, the temperature in B was increased to $T_{inj}$, and solution A was rapidly injected into B, which was accompanied by a temperature drop $\Delta T \approx 20°$ C. ($T_{growth}=T_{inj}-\Delta T$). After 5 hours at $T_{growth}$, the reaction mixture was allowed to cool.

Ethanol was added (a white flocculate from the clear yellow-orange solution was generally only observed for the largest NCs), and the NCs were separated from the reaction mixture by centrifugation (9000 rpm for 20 min). After two cycles of redispersion in hexane (1 mL) and reprecipitation by ethanol, 20-30 mg of precipitate was eventually collected and dispersed in a suitable nonpolar solvent. Undoped ZnO NCs were obtained by following the same reaction procedure, without the addition of the aluminum precursor, or, alternatively, by a direct heating approach (heating rate=15° C./min) by mixing the reagents in a single flask. The former route led to the formation of branched ZnO NCs while the latter to spherical NCs.

Nanocrystal Characterization

Low- and high-resolution TEM were carried out on JEOL 2100 and a JEOL 2100F microscopes, respectively, both operating at 200 kV. The latter was also used for High-Angle-Annular-Dark-Field Scanning Transmission Electron Microscopy (HAADF-STEM) images and electron diffraction (ED). Energy Dispersive X-ray (EDX) analysis was performed on the JEOL 2100F with a liquid nitrogen-cooled Oxford Instruments INCA-EDS detector. Samples for TEM analysis were prepared by drying a drop of hexane solution containing the NCs on the surface of a carbon-coated copper grid or a silicon nitride membrane window.

Elemental analysis was performed by ICP-AES with a Varian 720/730 Series spectrometer. The AZO samples were digested in concentrated HCl/HNO$_3$ (3/1 v/v). The relative error on the extracted Al content was within 3%, as evaluated on the basis of 9 replicates per each measurement.

XRD patterns were acquired using a Bruker D8 Discover X-ray diffractometer operating with CuKα radiation (λ=1.5406 Å) and equipped with a General Area Detector Diffraction System (GADDS). Samples were prepared by depositing NCs from solution on a silicon substrate. Rietveld analysis was performed using the Materials Analysis Using Diffraction (MAUD) program and the instrumental resolution function was refined by measuring a NIST LaB$_6$ powder standard. The best fit was achieved when an isotropic size-strain model was applied, in agreement with the isotropic shape of the NCs.[26]

Infrared spectra were recorded on a Perkin-Elmer FTIR Spectrum One spectrophotometer. AZO NC dispersions were analyzed by drying a drop on a ZnSe ATR (attenuated total reflectance) plate. The transmission spectrum of AZO films were recorded by depositing the films on double side polished ultrathin silicon substrates.

Visible/NIR absorption spectra were obtained with an ASD QualitySpec® Pro Spectrometer of dispersions of AZO NCs in tetrachloroethylene. Absorption spectra of the NCs dispersed in toluene, used for the band gap extrapolation, were recorded using a Shimadzu UV-3600 UV/VIS/NIR Spectrophotometer (in the 250-800 nm spectral range).

$^1$H NMR spectra were collected at 25° C. using a Bruker Biospin Avance II 500 MHz High Performance Spectrometer from NCs dried and redispersed in CDCl$_3$.

Scanning electron microscopy (SEM) imaging of NC thin films was carried out on a Zeiss Gemini Ultra-55 Analytical Scanning Electron Microscope, using a beam energy of 5 kV and an In-Lens detector.

Energy-dependent X-Ray photoelectron spectroscopy (XPS) surface analysis was performed at beamline 9.3.2, endstation Scienta 4000R-Hipp, at the Advanced Light Source, Lawrence Berkeley National Laboratory, with excitation energy of 630 eV and 800 eV. The electron escape depth was estimated to be about 1.5 nm and 1.2 nm in the case of 800 eV x-ray versus 630 eV. Relative quantification of Zn and Al was obtained by using CASA analysis program and fitting Gaussian-Lorenztian product functions to the background substracted XPS data (Tougaard background substraction algorithm).

Figure 14:
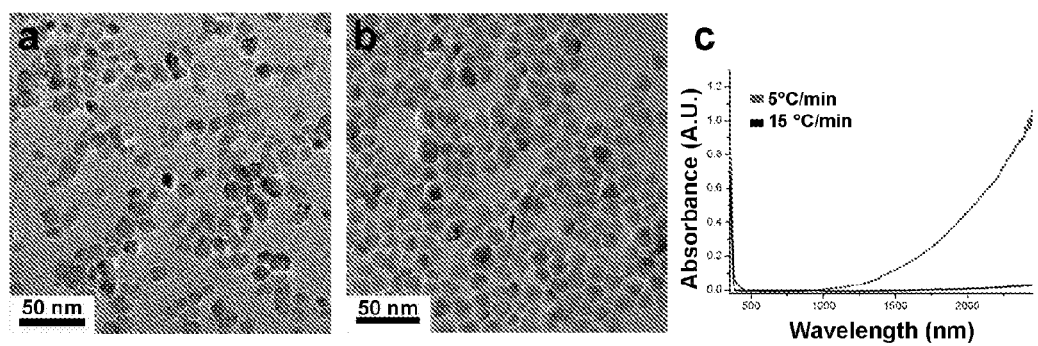
FIG. 14 shows images and a plot in accordance with an exemplary embodiment of the present invention.

FIG. 14a and FIG. 14b show TEM images while FIG. 14c shows optical absorbance spectrum of AZO NCs obtained by a slow heating approach, in accordance with an exemplary embodiment of the present invention. In more detail, 1 mmol of ZnSt$_2$, 3 mmol of OLAC, 10 mmol of 1,2 HDDIOL, 0.2 mmol of Al(acac)$_3$ were combined in 15 mL of ODE and heated at 140° C. for 1 h. Then the temperature was raised up to 260° C. with a heating rate of 5° C./min (FIG. 14a) and 15° C./min (FIG. 14b). The aluminum content determined by ICP is 6.5% for the sample (FIG. 14a) and 1.2% for the sample (FIG. 14b). A slower heating rate implies a slower growth of ZnO and more time for Al to be incorporated, but this happens at expenses of the monodispersity. On the opposite, a faster heating rate leads to higher monodispersity but lower aluminum content.

Figure 15:
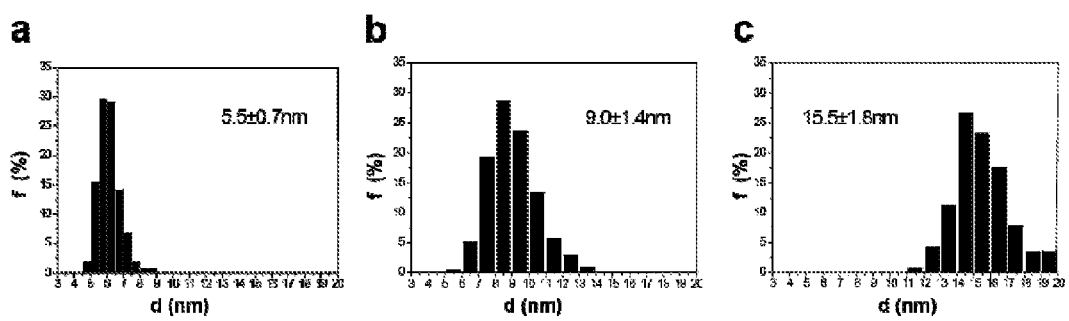
FIG. 15 shows plots in accordance with an exemplary embodiment of the present invention.

FIG. 15 depicts size distribution histograms for AZO NCs obtained by injecting a precursor solution containing 0.2 mmol of Al(acac)$_3$ at 230° C. (FIG. 15a), 240° C. (FIG. 15b) and 260° C. (FIG. 15c), in accordance with an exemplary embodiment of the present invention. Corresponding TEM images are shown in FIG. 10.

Figure 16:
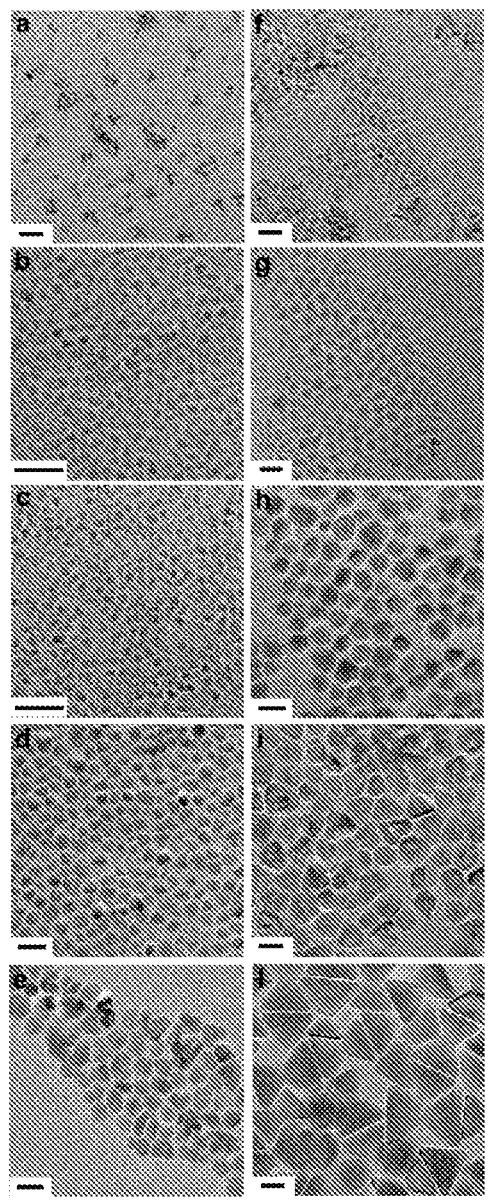
FIG. 16 shows images in accordance with an exemplary embodiment of the present invention.

FIG. 16 shows TEM images of samples obtained at T$_{inj}$/T$_{growth}$ Of 230 C/210 C (FIG. 16a-FIG. 16e) and 260 C/240 C (FIG. 16f-FIG. 16l) with different Al precursor content in the reaction flask: 0 mmol (a, f); 0.05 mmol (same morphology and size are obtained with 0.1 mmol) (FIG. 16b, FIG. 16g); 0.2 mmol (FIG. 16c, FIG. 16h); 0.3 mmol (FIG. 16d, FIG. 16i); 0.5 mmol (FIG. 16e, FIG. 16l). ZnSt$_2$ is fixed at 1 mmol. Scale bars are 20 nm.

By comparing the pure ZnO samples synthesized without Al(acac)$_3$ in the reaction flask, it was clear that there was a strong influence of Al incorporation and/or acetylacetone on the NC shape.

It was equally clear that the temperature played a dominant role influencing the size as well as on the aluminum incorporation, for a fixed Al(acac)$_3$:ZnSt$_2$ ratio and a fixed reaction time. This could probably be attributed to a faster overall reaction kinetics for both Zn (accounting for the bigger size) and Al (accounting for the higher doping content).

The temperature effect emerges clearly by comparing the 2 blank samples (FIG. 16a and FIG. 16f), the samples with same Al(acac)$_3$ content in the reaction mixture but grown at different temperature, and samples like the ones shown in panel (FIG. 16g), around 10 nm in diameter, and (FIG. 16c), around 5 nm in diameter, with the same Al doping (3.5%) but grown at different temperature.

However, at the same growth temperature, an increase in the Al(acac)$_3$ does lead to bigger nanoparticles and more anisotropic shapes. The aluminum incorporation itself and/or the higher concentration of acetylacetone in the reaction mixture could both contribute to this effect. Incorporation of dopants has been demonstrated to be responsible for shape and crystalline phase change.[15] From the other side, acetylacetone, slowly released during the NCs' growth from the partially substitution of coordinating ligands in Al(acac)$_3$ by oleic acid, could itself substitute stearate groups coordinating the zinc and lead to a faster reaction kinetics as well as it could gradually modify the chemical potential of the reaction environment so that bigger NCs (for the same reaction time) and more anisotropic shapes are obtained.

Figure 17:
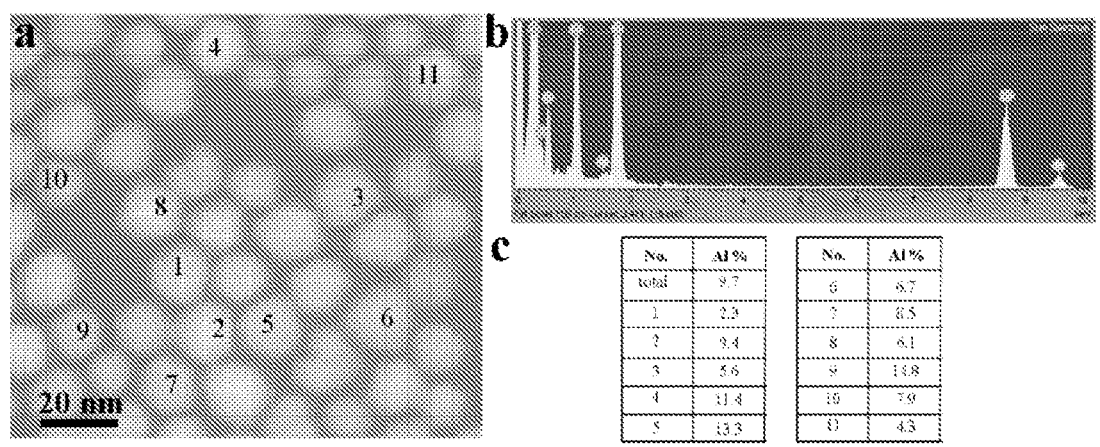
FIG. 17 shows an image, a plot, and data in accordance with an exemplary embodiment of the present invention.

FIG. 17a shows a High-Angle-Annular-Dark-Field Scanning Transmission Electron Microscopy (HAADF-STEM) image of 15 nm AZO nanocrystals with an average aluminum content of 7.3% determined by ICP-AES, in accordance with an exemplary embodiment of the present invention. FIG. 17b shows EDX spectrum of the whole area. FIG. 17c shows EDX results obtained from single particles as indicated in the electron image in FIG. 17a.

Figure 18:
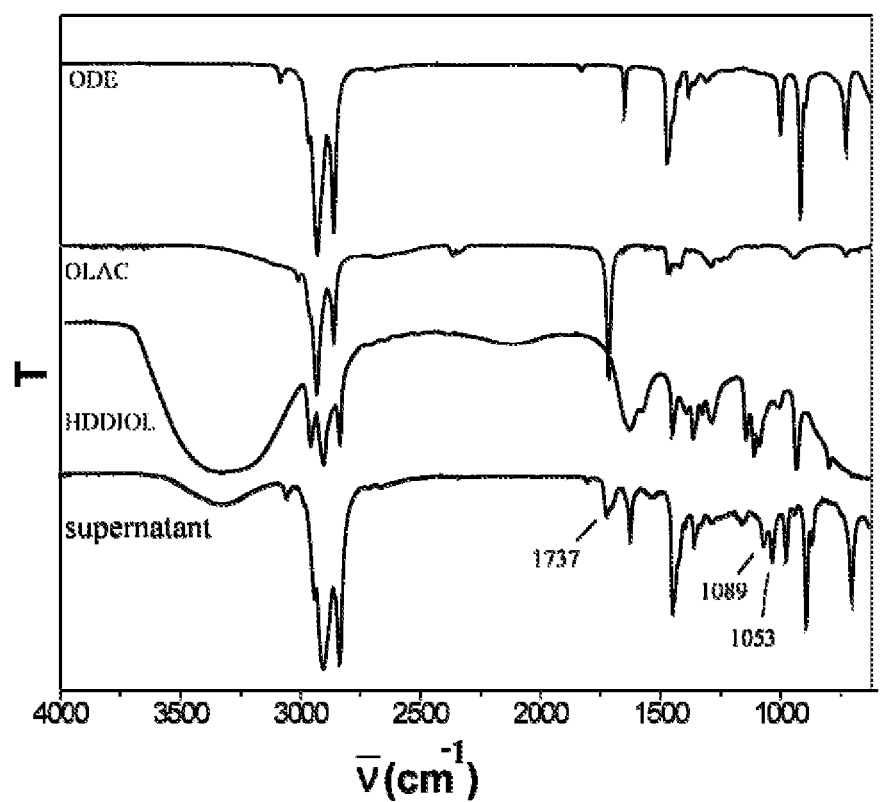
FIG. 18 is a plot in accordance with an exemplary embodiment of the present invention.

FIG. 18 shows the FTIR spectrum of the supernatant of a typical reaction carried out in presence of 0.2 mmol of Al(acac)$_3$ and with the precursor injection performed at 230° C. in accordance with an exemplary embodiment of the present invention. The stretching vibrations of the C=O at 1737 cm$^{-1}$ and of the C—O—C between 1100 cm$^{-1}$ and 1000 cm$^{-1}$ indicate the formation of an ester in the reaction mixture.

Figure 19:
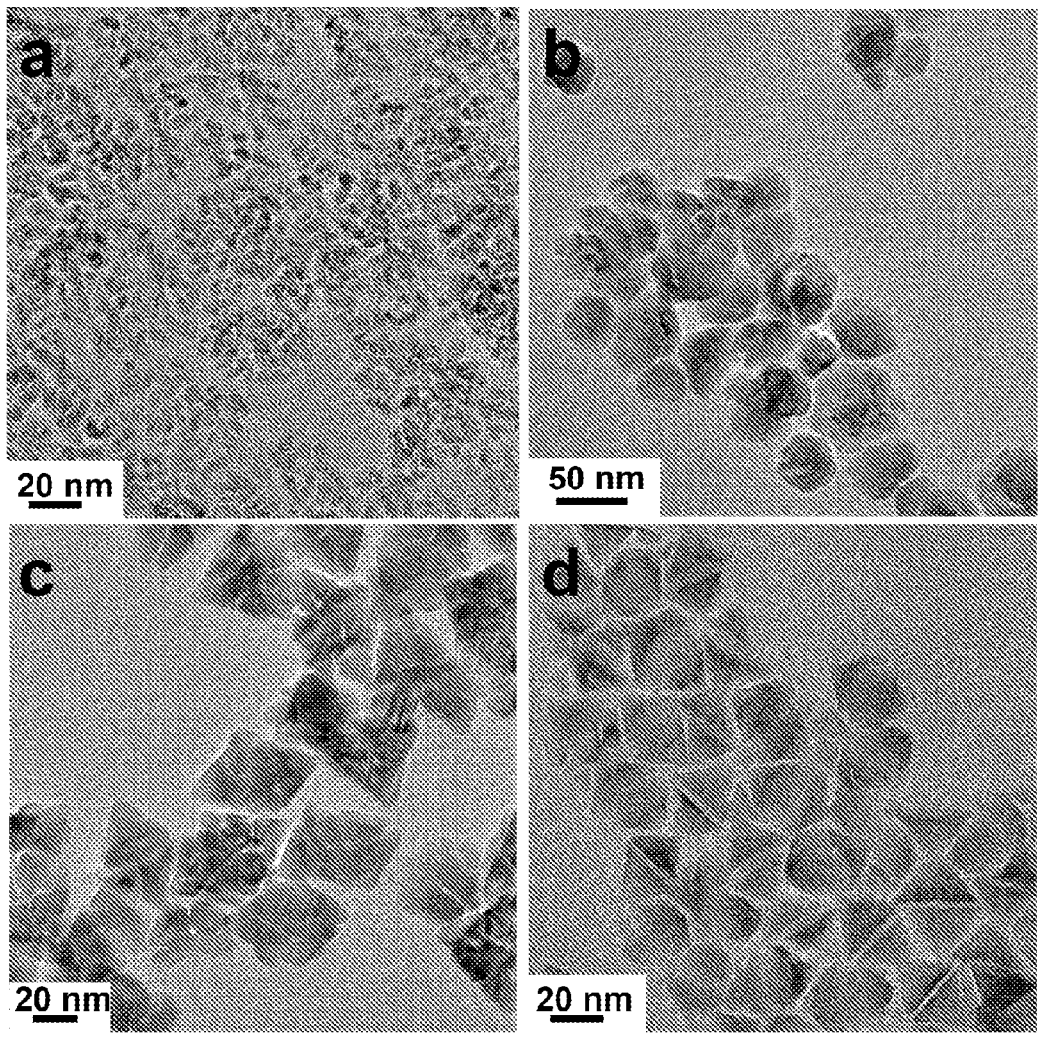
FIG. 19 shows images in accordance with an exemplary embodiment of the present invention.

FIG. 19 shows AZO nanoparticles, in accordance with an exemplary embodiment of the present invention, obtained by injecting a precursor solution containing 0.2 mmol of Al(acac)$_3$ at 230° C. in 11 mL of ODE with 10 mmol of (FIG. 19a) 1,2-propanediol, (FIG. 19b) 1,2-hexanediol, (FIG. 19c) 1,2-octanediol and (FIG. 19d) 1,2-decanediol. Using 1,2-dodecanediol gave similar results to 1,2-hexadecanediol. Shorter-chain diols induce faster alcholysis and reduce the aluminum incorporation (less than 1.5% by ICP).

Figure 20:
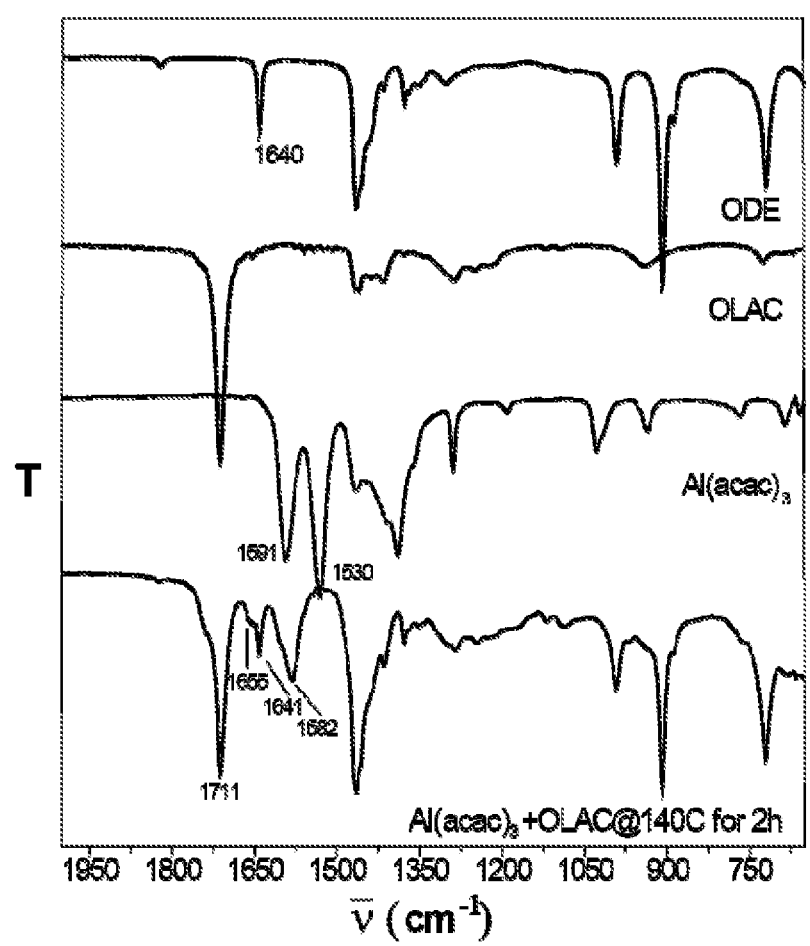
FIG. 20 is a plot in accordance with an exemplary embodiment of the present invention.

FIG. 20 shows the FTIR spectrum of a mixture containing 0.2 mmol of Al(acac)$_3$ and 3 mmol of OLAC heated at 140° C. for 1 h. The distinguishable peaks at 1655 cm$^{-1}$ and 1582 cm$^{-1}$ are attributed to the stretching vibrations of the carboxylate group upon the formation of aluminum oleate in the mixture. The value of the frequency difference between the carboxylate signals (~90 cm$^{-1}$) suggests that the OLAC ligands form bidentate chelates with Al cations.[31]

Figure 21:
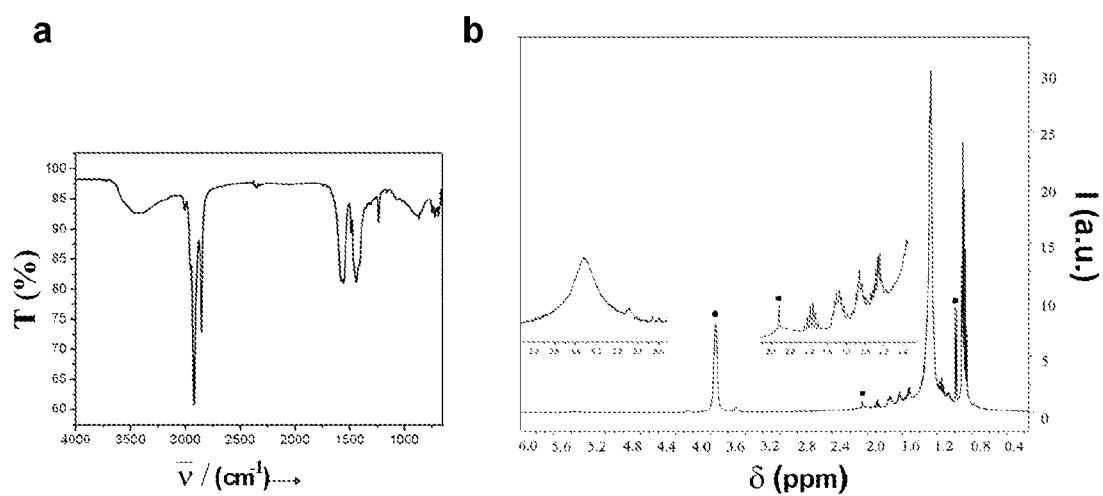
FIG. 21 shows plots in accordance with an exemplary embodiment of the present invention.

FIG. 21 shows identification of surface ligands by FTIR (FIG. 21a) and $^1$H NMR (FIG. 21b) spectroscopies on purified AZO nanoparticles. In the FTIR spectrum the presence of oleate on the surface emerges from the characteristic stretching vibrations of carboxylate anions at 1542 cm$^{-1}$ and 1442 cm$^{-1}$; however, the presence of the diol, cannot be excluded owing to the broad peak at 3500 cm$^{-1}$, assigned to O—H stretching. In the NMR spectrum the broad resonance at 5.36 ppm, distinctive of the olefinic protons, together with the shift to lower ppm and the appearance of new resonances and multiplets in the region of the methylene protons (between 2 ppm and 1.4 ppm) compared to the spectrum of pure oleic acid, are indicative of the oleate bound to the NC surfaces with restricted mobility. Resonances coming from residual octadecene (■) and ethanol (●), used during the NC washing procedure, are distinguishable.

Figure 22:
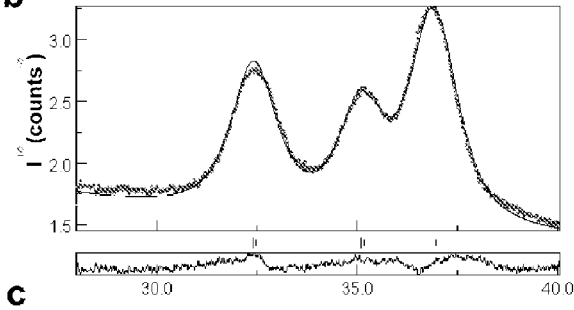
FIG. 22 shows data and plots in accordance with an exemplary embodiment of the present invention.
Figure 22:
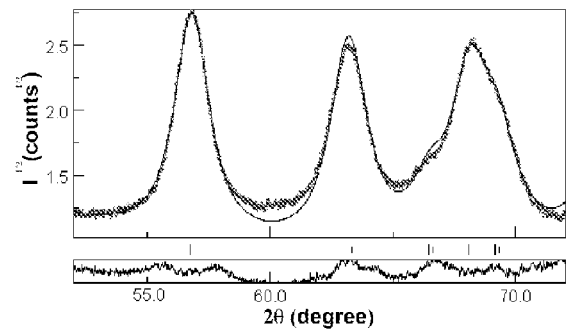

FIG. 22a shows structural and microstructural parameters obtained from Rietveld refinement (the numbers reported in parentheses refer to the error on the last digit) and statistical analysis on TEM images. The lattice parameters of all the samples, doped and undoped, are bigger than the ones reported for bulk ZnO wurtzite (a=3.25 Å and c=5.20 Å), consistent with the expected lattice expansion in metal oxide nanocrystals related to the increase in the Madelung energy in the lattice. An example of the profile fitting is showed in FIG. 22b and FIG. 22c, representing two different acquisition frames of the AZO sample containing 6.5% of Al. The black curve represents the fitting and the blue one the experimental data; on the bottom the difference profile between experimental and calculated curves.

A contraction of the lattice parameters (as reported in the main text) along with an increase in the inhomogeneous lattice strain can be detected in AZO NCs compared with ZnO NCs of similar size as a consequence of the introduction of Al in the lattice. In detail, an increase in the % strain of $$65\% \left(\frac{0.40-0.66}{0.40} \times 100\right),$$

$$114\% \left(\frac{0.21-0.45}{0.21} \times 100\right) \text{ and } 71\% \left(\frac{0.21-0.36}{0.21} \times 100\right)$$

can be observed for 4.4%, 6.5% and 7.3% of Al respectively. The non linear increase of the inhomogeneous lattice strain could be due to the imperfect comparison to a pure ZnO sample which is not exactly the same size as the sample containing 7.3% of Al.

Figure 23:
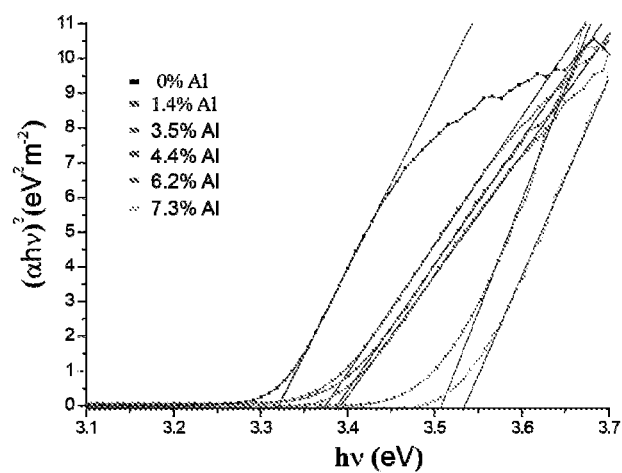
FIG. 23 is a plot in accordance with an exemplary embodiment of the present invention.

FIG. 23 shows plots of the square of the absorption coefficient versus the photon energy (hv) for AZO NCs with different aluminum content, in accordance with an exemplary embodiment of the present invention. The value of the optical band gap for each of them has been derived from the extrapolation to α=0.

Figure 24:
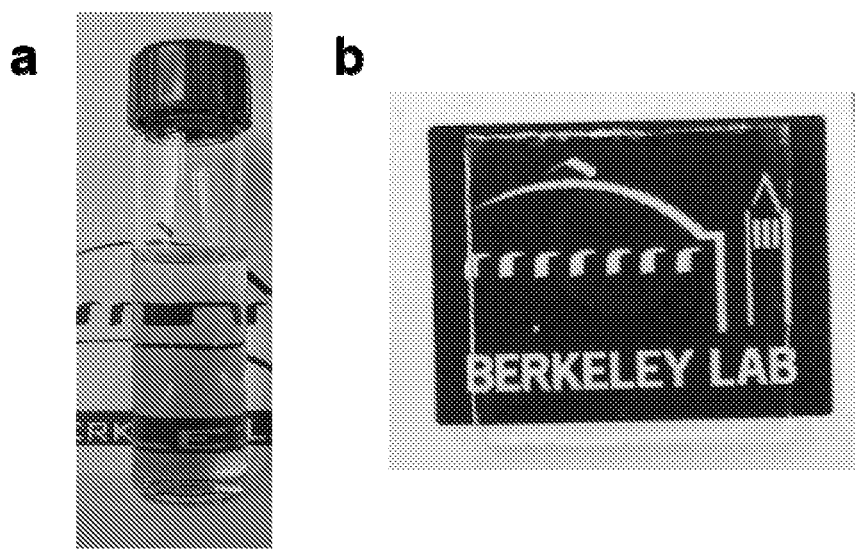
FIG. 24 shows images in accordance with an exemplary embodiment of the present invention.

FIG. 24 show pictures of AZO NCs (7.3% Al content) in solution (FIG. 24a) and deposited in films (FIG. 24b), in accordance with an exemplary embodiment of the present invention.

Figure 25:
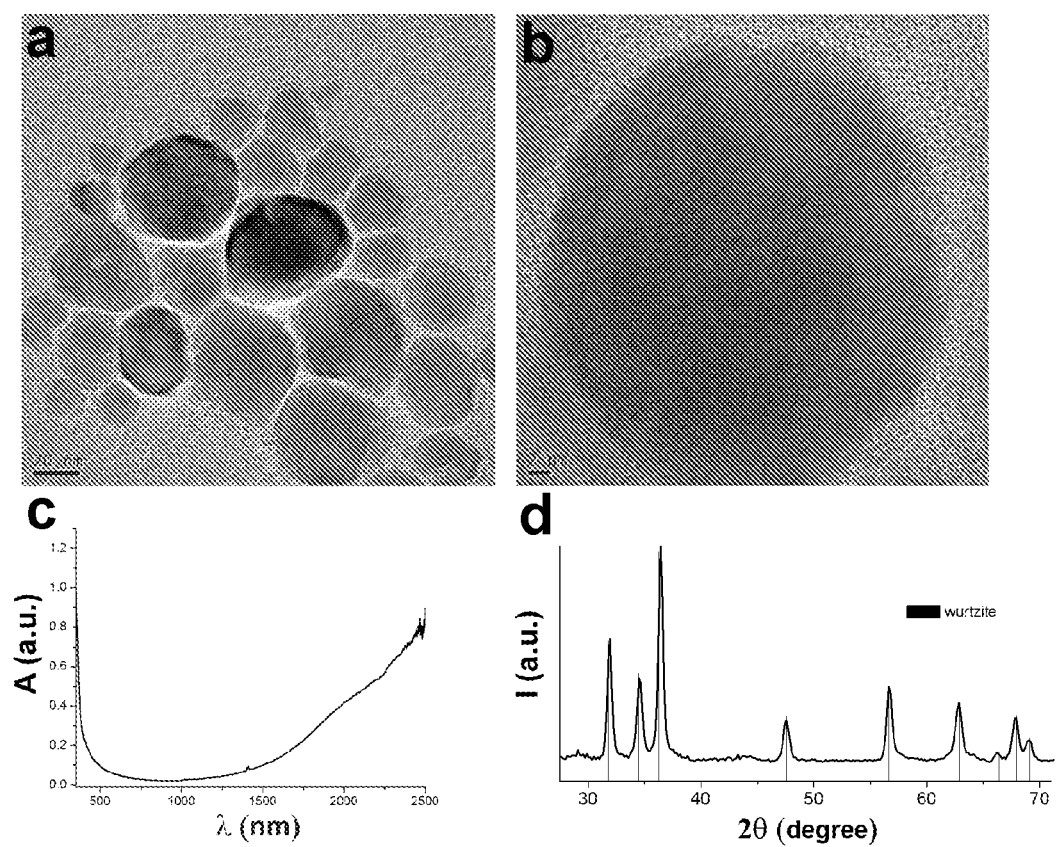
FIG. 25 shows images and plots in accordance with an exemplary embodiment of the present invention.

FIG. 25a and FIG. 25b show low- and high-resolution TEM images, FIG. 25c shows optical absorbance spectrum, and FIG. 25d shows the XRD pattern of an AZO sample containing 20% of aluminum, in accordance with an exemplary embodiment of the present invention. In the high resolution image (FIG. 25b) a crystalline region is visible on the external/thinner part of the nanoparticle, corresponding to the wurtzite phase as shown by the XRD pattern in (FIG. 25d), together with an amorphous or differently oriented region. The optical absorbance spectrum reveals scattering in the visible region, as a consequence of the poor dispersibility.

Figure 26:
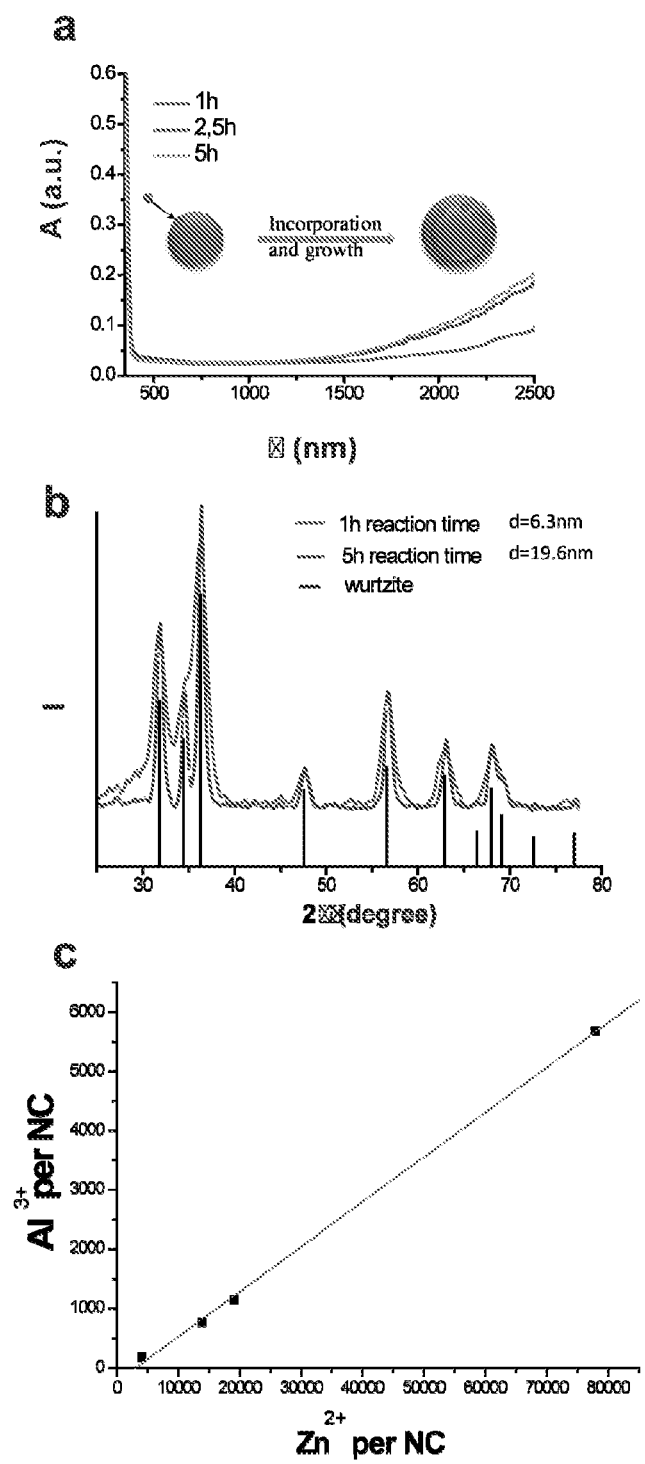
FIG. 26 shows plots in accordance with an exemplary embodiment of the present invention.

FIG. 26 shows evolution over time of the optical spectrum (FIG. 26a) and XRD pattern (FIG. 26b) of a synthesis performed by injecting a precursor solution containing 0.3 mmol of Al(acac)$_3$ at 230° C., in accordance with an exemplary embodiment of the present invention. FIG. 26c shows Al dopants (as derived by ICP-OES analysis) per nanocrystal plotted v.s. Zn$^{2+}$ cations. The different points on the line correspond to aliquots over time (at 1 h, 2 h, 3 h and 5 h) of a synthesis performed by injecting a precursor solution containing 0.2 mmol of Al(acac)$_3$ at 280° C. From extrapolation of the linear fit to zero Zn$^{2+}$, the undoped core diameter results to be around 2.7 nm[18].

Figure 27:
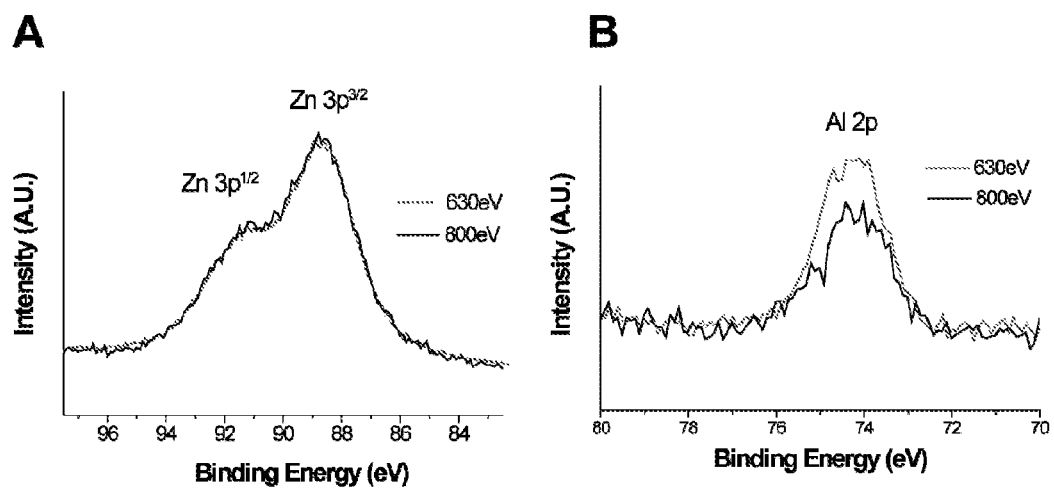
FIG. 27 shows plots in accordance with an exemplary embodiment of the present invention.

FIG. 27 shows energy-dependent XPS of AZO NCs (15 nm in size and 3.5% Al content), in accordance with an exemplary embodiment of the present invention. In (a) the Zn 3p peaks and in (FIG. 27b) the Al 2p peaks normalized by the Zn peak intensity. The relative Al % decreases by about 25% from the more superficial layer to the 0.3 nm deeper one sampled by 630 eV and 800 eV x-ray, respectively. This is consistent with the model of an Al-rich surface and an undoped core.

Exchanging Organic Ligands with Different Organic Ligands

The organic ligands were exchanged with different organic ligands by immersing the film in a 1M solution of the substituting organic ligands (fatty acid, amines, diols) in acetonitrile/chloroform (95/5) for 45 min, in accordance with an exemplary embodiment of the present invention. Samples were then rinsed in acetonitrile and dried with nitrogen gun prior the thermal treatment.

REFERENCES (1) Minami, T. *Semicond. Sci. Technol.* 2005, 20, S35-S44.
(2) Thu, T. V.; Maenosono, S. *J. Appl. Phys.* 2010, 107, 0143308.
(3) Chen, K. J.; Fang, T. H.; Hung, F. Y.; Ji, L. W.; Chang, S. J.; Young, S. J.; Hsiao, Y. *J. Appl. Surf. Sci.* 2008, 254, 5791.
(4) Kusinski, G. J.; Jokisaari, J. R.; Noriega, R.; Goris, L.; Donovan, M.; Salleo, A. *J. Microsc.* 2010, 237, 443.
(5) Lu, Z.; Zhou, J.; Wang, A.; Wang, N.; Yang, X. *J. Mater. Chem.* 2011, 21, 4161-4167.
(6) Kanehara, M.; Koike, H.; Yoshinaga, T.; Teranishi, T. *J. Am. Chem. Soc.* 2009, 131, 17736-17737.
(7) Wang, T.; Radovanovic, P. V. *J. Phys. Chem. C* 2011, 115, 406-4013.
(8) Hammarberg, E.; Prodi-Schwab, A.; Feldmann, C. *J. Colloid Inter. Sci.* 2009, 334, 29-36.
(9) Habas, S.; Platt, H. S.; van Hest, M. F. A. M.; Ginley, D. S. *Chem. Rev.* 2010, 110, 6571-6594.
(10)(a) Pflughoefft, M.; Weller, H. *J. Phys. Chem. B* 2002, 106, 10530-10534. (b) Wang, C.; Shim, M.; Guyot-Sionnest, P. *Science* 2001, 291, 2390-2392. (c) Halme, J.; Vahermaa, P.; Miettunen, K.; Lund, P. *Adv. Mater.* 2011, 22, E210-E234. (d) Aksu, Y.; Frasca, S.; Wollenberger, U.; Driess, M.; Thomas, A. *Chem. Mater.* 2011, 23, 1798-

1804. (e) Schlapak, R.; Armitage, D.; Saucedo-Zeni, N.; Hohage, M.; Howorka, S. *Langmuir* 2007, 23, 10244-10253 and references herein. (f) Caruntu, D.; Yao, K.; Zhang, Z.; Austin, T.; Zhou, W.; O'Connor, C. J. *J. Phys. Chem. C* 2010, 114, 4875-4886.

(11) Serier, H.; Gaudon, M.; Mènètrier, M. *Solid State Sci.* 2009, 11, 1192-1197.

(12) Dasgupta, N. P.; Neubert, S.; Lee, W.; Trejo, O.; Lee, J.-R.; Prinz, F. B. *Chem. Mater.* 2010, 22, 4769-4775.

(13) Bahsi, Z. B.; Aslan, M. H.; Ozer, M.; Oral, A. Y. *Cryst. Res. Technol.* 2009, 44, 961-966.

(14) Fox, M. *Optical Properties of Solids*; Oxford University Press: New York, 2001; p. 143-162.

(15) Norris, D. J.; Efros, A. L.; Erwin, S. C. *Science* 2008, 319, 1776-1779.

(16) Zu, L.; Norris, D. J.; Kennedy, T. A.; Erwin, S. C.; Efros, A. L. *Nanoletters* 2006, 6, 334-340.

(17) Beaulac, R.; Ochsenbein, S. T.; Gamelin D. R. In *Nanocrystal Quantum Dots*; Klimov, I. V., Ed.; Taylor & Francis: New York, 2010; pp. 397-453.

(18) Norberg, N. S.; Parks, G. L.; Salley, G. M.; Gamelin, D. R. *J. Am. Chem. Soc.* 2006, 128, 13195-13203.

(19) Bryan, J. D.; Gamelin, D. R. *Progress in Inorganic Chemistry* 2005, 54, 47-126.

(20) Jun, Y.-w.; Choi, J.-S.; Cheon, J. *Angew. Chemie. Int. Ed.* 2006, 45, 3414-3439.

(21) Perebeinosa, V.; Chan, S.-W.; Zhang, F. *Solid State Commun.* 2002, 123, 295-297.

(22)(a) Whitaker, K. M.; Ochsenbein, S. T.; Polinger, V. Z.; Gamelin, D. R. *J. Phys. Chem. C* 2008, 112, 14331-14335. (b) Liu, W. K.; Whitaker, K. M.; Smith, A. L.; Kittilstved, K. R.; Robinson, B. H.; Gamelin, D. R. *Phys. Rev. Lett.* 2007, 98. 186804. (c) Shim, M.; Guyot-Sionnest P. *J. Am. Chem. Soc.* 2001, 123, 11651-11654.

(23) Mridha, S.; Basak, D. *J. Phys. D: Appl. Phys.* 2007, 40, 6902-6907.

(24) Lu, J. G.; Fujita, S.; Kawaharamura, T.; Nishinaka, H.; Kamada, Y.; Ohshima, T.; Ye, Z. Z.; Zeng, Y. J.; Zhang, Y. Z.; Zhu, L. P.; He, H. P.; Zhao, B. H. *J. Appl. Phys.* 2007, 101, 083705-1/7.

(25) Suwanboon, S.; Amornpitoksuk, P.; Haidoux, A.; Tedenac, J. C. *J. Alloy Comp.* 2008, 462, 335-339.

(26) Yu, P.; Cadorna, M. *Fundamentals of Semiconductors*, Springer: Berlin, 1996; pp. 253-273.

(27) Dekeijser, T. H.; Mittemeijer, E. J.; H. C. F. Rozendaal, *J. Appl. Crystallogr.* 1983, 16, 309-316.

(28)(a) Naika, G. V.; Shalaeva, V. M.; Boltasseva, A. *Proc. of SPIE* 2010, 7754, 77540M-1. (b) Naik, G. V.; Boltasseva, A. *Metamaterials* 2011, 5, 1-7. (c) Nikolajsen, T.; Leosson, K.; Bozhevolnyia, S. I. *Appl. Phys. Lett.* 2004, 85, 5833-5835. (d) Franzen, S. *J. Phys. Chem. C*, 2008, 112, 6027-6032

(29) A. Rogach, D. V. Talapin, H. Weller, "Applications of semiconductor nanocrystals", *Colloids and Colloidal Assembly*, F. Caruso Editor, 2004, Wiley-VCH Verlag GmbH&Co

(30) Peng, X., *Nano Res.* 2009, 2, 425-447

(31) L. M. Bronstein, X. Huang, J. Retrum, A. Schmucker, M. Pink, B. Stein, B. Dragnea *Chem. Mater.* 2007, 19, 3624-3632.

CONCLUSION

It is to be understood that the above description and examples are intended to be illustrative and not restrictive. Many embodiments will be apparent to those of skill in the art upon reading the above description and examples. The scope of the invention should, therefore, be determined not with reference to the above description and examples, but should instead be determined with reference to the appended claims, along with the full scope of equivalents to which such claims are entitled. The disclosures of all articles and references, including patent applications and publications, are incorporated herein by reference for all purposes.

What is claimed is:

1. A method comprising:
   injecting a precursor mixture comprising a zinc precursor, an aluminum precursor, an amine, and a fatty acid into a solution of a vicinal diol and a non-coordinating solvent to produce a reaction mixture, wherein the non-coordinating solvent is selected from a group consisting of octadecene, benzylether, and phenylether;
   precipitating aluminum-doped zinc oxide nanocrystals from the reaction mixture to form a final precipitate; and
   dissolving the final precipitate in an apolar solvent.

2. The method of claim 1, wherein the zinc precursor is selected from a group consisting of zinc stearate, zinc acetylacetonate, and zinc acetate.

3. The method of claim 1, wherein the aluminum precursor is selected from a group consisting of aluminum acetylacetonate, aluminum stearate, and aluminum oleate.

4. The method of claim 1, wherein the amine comprises oleylamine.

5. The method of claim 1, wherein the fatty acid is selected from a group consisting of oleic acid and stearic acid.

6. The method of claim 1, wherein the vicinal diol is selected from a group consisting of 1,2-dodecanediol, 1,2-hexadecanediol, and 1-2 octanediol.

7. A method comprising:
   injecting a precursor mixture comprising a zinc precursor, an aluminum precursor, an amine, and a fatty acid into a solution of a vicinal diol and a non-coordinating solvent to produce a reaction mixture, wherein the aluminum precursor is selected from a group consisting of aluminum stearate and aluminum oleate;
   precipitating aluminum-doped zinc oxide nanocrystals from the reaction mixture to form a final precipitate; and
   dissolving the final precipitate in an apolar solvent.

8. The method of claim 1, wherein precipitating the aluminum-doped zinc oxide nanocrystals comprises:
   washing the aluminum-doped zinc oxide nanocrystals in the reaction mixture with a second apolar solvent;
   dissolving the washed nanocrystals in a third apolar solvent; and
   rinsing the dissolved nanocrystals in the second apolar solvent.

9. The method of claim 8, wherein the second apolar solvent comprises ethanol and the third apolar solvent is selected from a group consisting of hexane and toluene.

10. The method of claim 1, wherein the apolar solvent is selected from a group consisting of hexane, toluene, and chloroform.

11. The method of claim 1, wherein a temperature of the solution is between 230° C. and 280° C. during the injecting.

12. The method of claim 1, wherein a temperature of the solution between 210° C. and 260° C. during the precipitating.

13. The method of claim 1, wherein precipitating the aluminum-doped zinc oxide nanocrystals comprises reacting the mixture with the solution to incorporate aluminum in the aluminum precursor into a crystal lattice of a zinc oxide reaction product.

14. The method of claim 1, further comprising:
depositing the aluminum-doped zinc oxide nanocrystals on a substrate.

15. The method of claim 14, wherein the substrate is selected from a group consisting of glass, silicon, quartz, indium tin oxide, and fluorine-doped $SnO_2$.

16. The method of claim 14, further comprising:
removing organic ligands from surfaces of the aluminum-doped zinc oxide nanoparticles.

17. A method comprising:
injecting a precursor mixture comprising a zinc precursor, an aluminum precursor, an amine, and a fatty acid into a solution of a vicinal diol and a non-coordinating solvent to produce a reaction mixture;
precipitating aluminum-doped zinc oxide nanocrystals from the reaction mixture to form a final precipitate; and
dissolving the final precipitate in an apolar solvent, wherein the apolar solvent comprises toluene.

* * * * *